(12) United States Patent
Mori

(10) Patent No.: US 10,746,765 B2
(45) Date of Patent: Aug. 18, 2020

(54) DATA PROCESSING METHOD AND THE MEASUREMENT DEVICE

(71) Applicant: Mitsui E&S Machinery Co., Ltd., Chuo-ku, Tokyo (JP)

(72) Inventor: Yasunari Mori, Tamano (JP)

(73) Assignee: Mitsui E&S Machinery Co., Ltd. (JP)

(*) Notice: Subject to any disclaimer, the term of this patent is extended or adjusted under 35 U.S.C. 154(b) by 262 days.

(21) Appl. No.: 15/842,740

(22) Filed: Dec. 14, 2017

(65) Prior Publication Data

US 2018/0246148 A1  Aug. 30, 2018

(30) Foreign Application Priority Data

Feb. 24, 2017  (JP) ................ 2017-033282

(51) Int. Cl.
| | |
|---|---|
| *G01R 19/04* | (2006.01) |
| *G01R 23/02* | (2006.01) |
| *G01S 13/89* | (2006.01) |
| *G01S 13/42* | (2006.01) |
| *G01S 13/34* | (2006.01) |

(Continued)

(52) U.S. Cl.
CPC ............ *G01R 19/04* (2013.01); *G01R 23/02* (2013.01); *G01S 13/34* (2013.01); *G01S 13/426* (2013.01); *G01S 13/888* (2013.01); *G01S 13/89* (2013.01); *G01S 2007/356* (2013.01)

(58) Field of Classification Search
CPC ......... G01R 19/04; G01R 23/02; G01S 13/89; G01S 13/426; G01S 13/34; G01S 13/888; G01S 2007/356
See application file for complete search history.

(56) References Cited

U.S. PATENT DOCUMENTS

| | | | |
|---|---|---|---|
| 2011/0298653 A1* | 12/2011 | Mizutani .............. | G01S 13/32 342/147 |
| 2013/0251222 A1* | 9/2013 | Huang .................... | A61B 8/13 382/131 |

(Continued)

FOREIGN PATENT DOCUMENTS

JP  2015-095840  5/2015

*Primary Examiner* — Mohammad K Islam
(74) *Attorney, Agent, or Firm* — Thorpe North & Western

(57) ABSTRACT

A data processing method and a measurement device is provided in which an electromagnetic wave radiates toward an object to be measured and measurement data obtained by measuring reflected wave of the electromagnetic wave reflected from the object to be measured is processed. First processing data $S(k_x, k_y, \omega)$ is acquired by performing discrete Fourier transform (DFT) relating to an x-coordinate component and a y-coordinate component on measurement data $s(x', y', \omega)$. Then, an angular frequency $\omega$ is converted into a kz component after extending a range from which a ky component can vary, thereby calculating second processing data $S'(kx, ky, kz)$. Then, the second processing data is subjected to inverse Fourier transform to calculate data $f(x, y, z)$ of reflexibility of the object to be measured. In the extension of the ky component, local maximum value processing and a process of suppressing generation of an aliasing component using a ratio are performed.

14 Claims, 17 Drawing Sheets

(51) Int. Cl.
*G01S 13/88* (2006.01)
*G01S 7/35* (2006.01)

(56) References Cited

U.S. PATENT DOCUMENTS

| | | | | |
|---|---|---|---|---|
| 2016/0070013 | A1* | 3/2016 | Meunier | G01V 1/32 |
| | | | | 702/18 |
| 2016/0091387 | A1* | 3/2016 | Muehleisen | G01M 3/24 |
| | | | | 73/592 |
| 2016/0377557 | A1* | 12/2016 | Kimura | G01N 22/00 |
| | | | | 324/638 |
| 2017/0176583 | A1* | 6/2017 | Gulden | G01S 13/50 |
| 2018/0088224 | A1* | 3/2018 | Kishigami | H01Q 21/06 |
| 2018/0267157 | A1* | 9/2018 | Guruprasad | G01S 17/006 |
| 2018/0308259 | A1* | 10/2018 | Kimura | H04N 19/172 |
| 2019/0079179 | A1* | 3/2019 | Kitamura | G01S 7/02 |
| 2019/0339380 | A1* | 11/2019 | Marks | G01S 13/887 |

* cited by examiner

CORRECTED TEMPORAL WAVEFORM DATA SET  $d(x_i, y_i, t_j)(i=1 \sim M, j=1 \sim N) = d_{ij}$ $$\begin{array}{c|cccc}
 & 1 & \xrightarrow{y} & M \\
\hline
1 & d_{11} & d_{21} \cdots \cdots & d_{M1} \\
t\downarrow & d_{12} & d_{22} \cdots \cdots & d_{M2} \\
 & \vdots & \vdots & \vdots \\
N & d_{1N} & d_{2N} \cdots \cdots & d_{MN}
\end{array}\Bigg\} d: \text{CORRECTED TEMPORAL WAVEFORM DATA SET}$$

FIG.9A d1: FIRST EXTENDED/CORRECTED TIME WAVEFORM DATA SET

↓ DFT

FIRST EXTENDED/CORRECTED FREQUENCY AND WAVENUMBER DATA
$D1(k_x, k_y, \omega)$

FIG.9B d2: SECOND EXTENDED/CORRECTED TIME WAVEFORM DATA SET

↓ DFT

SECOND EXTENDED/CORRECTED FREQUENCY AND WAVENUMBER DATA
$D2(k_x, k_y, \omega)$

FIG.9C

$$S_2(k_x, k_y, \omega) = \left[\frac{D1(k_x,k_y,\omega)}{D2(k_x,k_y,\omega)}\right] \cdot D3(k_x, k_y, \omega)$$

ial No.is l(A) a step of causing the computer to acquire measurement data (e.g. s(x', y', ω)) whose value is fixed by the frequency (e.g. an angular frequency ω=2πf (f is a frequency)) and a value of at least one of second spatial coordinate components (e.g. an x component and a y component) of the space while generating the wave having the frequency changed at a set frequency interval, the measurement data being acquired by sampling a response of the wave in the space at a sampling interval that is rougher regarding the second spatial coordinate components (e.g. the x component and the y component) of the space than a spatial resolution defined by a sampling theorem from a maximum frequency of the frequency, the second spatial coordinate components (e.g. the x component and the y component) being portions of whole spatial coordinate components of the space (e.g. the x component, the y component, and a z component) except for a first spatial coordinate component (e.g. the z component);

DATA PROCESSING METHOD AND THE MEASUREMENT DEVICE

PRIORITY CLAIM

Priority is claimed to Japan Patent Application Serial No. 2017-033282 filed on Feb. 24, 2017.

BACKGROUND

Technical Field

The present technology relates to a data processing method, which uses a computer to process measurement data of a wave, such as an electromagnetic wave, whose value is fixed by a frequency of the wave generated in a space and a value of a spatial coordinate of the space, and a measurement device which measures a wave and perform data processing thereof.

Related Art

Conventionally, a radar apparatus, which employs an array antenna obtained by arranging a plurality of antenna on a plane, has been known for a method of inspecting an inside of a non-metal structure, such as concrete and wood, in a non-destructive manner. For example, the array antenna is configured by arranging antennas, such as planar antennas, side by side in one direction such that a transmission array antenna and reception array antenna are arranged to be adjacent to each other. In addition, in the radar apparatus, an object to be measured is measured using wide-band frequencies while changing a frequency of an electromagnetic wave with a set frequency interval in order to accurately measure the inside of the structure.

For the radar apparatus, it is desired to enhance high spatial resolution in measurement in order to accurately inspect the inside of the structure. In general, spatial resolution of data obtained by radiation of a wave having a frequency, such as an electromagnetic wave, is determined based on a center frequency of the wave when a distance between a structure that is an object to be measured and both of measurement surfaces of a transmission array antenna and a reception array antenna is relatively close, for example, the distance is a fourth of an array length of the array antennas and a measurement interval of measurement data is small. Herein, the spatial resolution is a resolution in a plane in which the respective antennas of the array antenna are arranged.

For example, a theoretical spatial resolution in a case where the measurement interval along the plane of the measurement data is sufficiently small becomes a fourth of a wavelength of the wave at a center frequency of a frequency band when the frequency of the radiating wave is swept with the frequency band on consideration of a reciprocating path of the electromagnetic wave. However, when the measurement interval of the measurement data is large, and this measurement interval exceeds a fourth of a minimum wavelength of the electromagnetic wave, the spatial resolution in actual measurement becomes rougher than the theoretical spatial resolution and becomes a measurement interval in some cases.

In regard to the radar apparatus using the array antenna, for example, a radar apparatus that is configured such that a transmission array antenna and a reception array antenna each of which is configured using a plurality of planar antennas are formed on the common dielectric substrate has been known (Japanese Unexamined Patent Application Publication No. 2015-095840 A). In this radar apparatus, an arrangement direction of the planar antennas of the transmission array antenna is parallel to an arrangement direction of the planar antennas of the reception array antenna, and each of the planar antennas of the reception array antenna is located between two adjacent planar antennas of the transmission array antenna in the arrangement direction.

In the above-described radar apparatus, an electromagnetic wave is measured with a wide frequency band from a low frequency to a high frequency, and thus, a maximum wavelength of the electromagnetic wave becomes long. Thus, a size of each antenna forming the array antenna becomes large, and a length of the antenna in the array antenna in the arrangement direction becomes long. As a result, an arrangement interval of the antennas in the reception array antenna becomes long, and the above-described measurement interval of measurement data is likely to exceed a fourth of a minimum wavelength of the radiating electromagnetic wave, the spatial resolution decreases to be rougher than the theoretical resolution, and further, an aliasing component is easily generated in the measurement data. It is necessary to decrease the arrangement interval and increase the number of arranged antennas of the reception array antenna in order to set the spatial resolution to be the theoretical spatial resolution (a fourth of the wavelength of the electromagnetic wave at the center frequency), which is in the most preferable condition. However, when the number of arranged antennas is increased, cost of the radar apparatus increases, and further, a circuit configuration of the radar apparatus becomes complicated, which is not preferable.

Thus, the present technology aims to provide a data processing method and a measurement device capable of improving the spatial resolution in measurement while maintaining the number of arranged antennas to be constant.

SUMMARY

An aspect of the present technology is a data processing method that causes a computer to process measurement data of a wave whose value is fixed by a frequency of the wave generated in a space and a value of a spatial coordinate of the space.

The data processing method includes:

(A) a step of causing the computer to acquire measurement data (e.g. s(x', y', ω)) whose value is fixed by the frequency (e.g. an angular frequency ω=2πf (f is a frequency)) and a value of at least one of second spatial coordinate components (e.g. an x component and a y component) of the space while generating the wave having the frequency changed at a set frequency interval, the measurement data being acquired by sampling a response of the wave in the space at a sampling interval that is rougher regarding the second spatial coordinate components (e.g. the x component and the y component) of the space than a spatial resolution defined by a sampling theorem from a maximum frequency of the frequency, the second spatial coordinate components (e.g. the x component and the y component) being portions of whole spatial coordinate components of the space (e.g. the x component, the y component, and a z component) except for a first spatial coordinate component (e.g. the z component);

(B) a step of causing the computer to convert the second spatial coordinate components (e.g. the x component and the y component) of the measurement data into wavenumber components (e.g. a kx component and a ky component) to calculate first processing data (e.g. $S(k_x, k_y, \omega)$) as a wavenumber conversion result of the measurement data whose value is fixed by the frequency (e.g. an angular frequency $\omega$) and values of the wavenumber components (e.g. the kx component and the ky component) corresponding to the second spatial coordinate components (e.g. the x component and the y component);

(C) a step of causing the computer to reconstruct the first processing data into second processing data (e.g. $S'(k_x, k_y, k_z)$) by calculating a first wavenumber component (e.g. the kz component) corresponding to the first spatial coordinate component (e.g. the z component) from the frequency (e.g. an angular frequency $\omega$) and the wavenumber components (e.g. the kx component and the ky component) corresponding to the second spatial coordinate components under a restraint condition (e.g. $k_x^2+k_y^2+k_z^2=4\times\varepsilon_r\times(\omega/c_0)^2$), a value of the second processing data (e.g. $S'(k_x, k_y, k_z)$) being fixed by values of whole wavenumber components (e.g. the kx component, the ky component, and kz component) corresponding to the whole spatial coordinate components (e.g. the x component and the y component, and the z component) of the space, the restraint condition defining relation between the whole wavenumber components corresponding to the whole spatial coordinate components of the space and the frequency (e.g. $k_x^2+k_y^2+k_z^2=4\times\varepsilon_r\times(\omega/c_0)^2$); and (D) a step of causing the computer to convert the whole wavenumber components (e.g. the kx component, the ky component, and the kz component) of the second processing data into the whole spatial coordinate components (e.g. the x component, the y component, and the z component) of the space to calculate third processing data (e.g. $f(x, y, z)$) whose value is fixed by values of the whole spatial coordinate components, wherein the step of causing the computer to reconstruct the first processing data (e.g. $S(k_x, k_y, \omega)$) includes a step of causing the computer to perform extension processing on the first processing data (e.g. $S(k_x, k_y, \omega)$) to extend a maximum wavenumber of a second wavenumber component (e.g. the ky component) corresponding to at least one of second spatial coordinate components (e.g. the y component). The extension processing on the first processing data is performed in order to suppress generation of an aliasing component in the third processing data (e.g. $f(x, y, z)$).

The extension processing is preferably performed using a corrected temporal waveform data set (e.g. d: see FIG. 9A) including corrected temporal waveform data, the corrected temporal waveform data being obtained by correcting temporal waveform data (see FIG. 8A) that is generated from the first processing data by converting the second wavenumber component (e.g. the ky component) and the frequency (e.g. the angular frequency $\omega$) of the first processing data (e.g. $S(k_x, k_y, \omega)$) into a corresponding spatial coordinate component (e.g. the y component) that corresponds to the second wavenumber component and a time component, the temporal waveform data being corrected to obtain the corrected temporal waveform data (see FIG. 8B) for each value of the corresponding spatial coordinate component by holding only local maximum values of absolute values of the temporal waveform data along an time axis while assigning a value zero to an area other than data points of the local maximum values.

The extension processing preferably includes:

(E1) a step of causing the computer to arrange the corrected temporal waveform data set (e.g. d) in a range of the corresponding spatial coordinate component before being extended and a range of the time component before being extended on an extended coordinate space in which the range of the corresponding spatial coordinate component and the range of the time component of the corrected temporal waveform data set are extended, and to generate a first extended/corrected temporal waveform data set (e.g. d1) and a second extended/corrected temporal waveform data set (e.g. d2), the first extended/corrected temporal waveform data set (see FIG. 9B) including first extended/corrected temporal waveform data in which a value zero is assigned to an extended part on the extended coordinate space, the second extended/corrected temporal waveform data set (see FIG. 9C) including the first extended/corrected temporal waveform data, in which a value zero is assigned every certain interval of the corresponding spatial coordinate component in the first extended/corrected temporal waveform data set;

(E2) a step of causing the computer to generate a ratio (e.g. $[D1(k_x, k_y, \omega)/D2(k_x, k_y, \omega)]$) between first extended/corrected frequency and wavenumber data (e.g. $D1(k_x, k_y, \omega)$) and second extended/corrected frequency and wavenumber data (e.g. $D2(k_x, k_y, \omega)$) (see FIG. 11), the first extended/corrected frequency and wavenumber data (e.g. $D1(k_x, k_y, \omega)$) being obtained by converting and expressing the first extended/corrected temporal waveform data set (e.g. d1) with a second wavenumber component (e.g. ky component) and the frequency (e.g. the angular frequency $\omega$), and the second extended/corrected frequency and wavenumber data (e.g. $D2(k_x, k_y, \omega)$) being obtained by converting and expressing the second extended/corrected temporal waveform data set (e.g. d2) with the second wavenumber component (e.g. ky component) and the frequency (e.g. the angular frequency $\omega$); and (E3) a step of causing the computer to generate a third extended/corrected temporal waveform data set (e.g. d3:see FIG. 10) including third extended/corrected temporal waveform data, the third extended/corrected temporal waveform data set being obtained by arranging the corrected temporal waveform data at the certain interval in the corresponding spatial coordinate component on the extended coordinate space and assigning a value zero to a part other than a part in which the corrected temporal waveform data is arranged, and to multiply or divide third extended/corrected frequency and wavenumber data (e.g. $D3(k_x, k_y, \omega)$) by the ratio, the third extended/corrected frequency and wavenumber data (e.g. $D3(k_x, k_y, \omega)$) being obtained by converting and expressing the third extended/corrected temporal waveform data set (e.g. d3) with the second wavenumber component (e.g. ky component) and the frequency (e.g. the angular frequency $\omega$), in order to obtain a result of the extension processing.

The extension processing preferably includes (E4) a step of causing the computer to obtain processing data by multiplying or dividing the third extended/corrected frequency and wavenumber data (e.g. $D3(k_x, k_y, \omega)$) by the ratio (e.g. $[D1(k_x, k_y, \omega)/D2(k_x, k_y, \omega)]$), and further to obtain processing temporal waveform data (e.g. $d4_{ij}$) by converting and expressing the processing data (e.g. D3($k_x$, $k_y$, ω))*[D1($k_x$, $k_y$, ω)/D2($k_x$, $k_y$, ω)]) with the corresponding spatial coordinate component and the time component (see FIG. 12A);

to generate fourth extended/corrected temporal waveform data set from the third extended/corrected temporal waveform data set by assigning a value of the processing temporal waveform data (e.g. $d4_{ij}$) of a part corresponding to a zero-filled part in which the value zero is assigned in the step (E3), to the zero-filled part instead of the value zero in the third extended/corrected temporal waveform data set, and to newly set the fourth extended/corrected temporal waveform data set as the third extended/corrected temporal waveform data set (e.g. d3) (see FIG. 12B); and, to multiply or divide the third extended/corrected frequency and wavenumber data (e.g. D3($k_x$, $k_y$, ω)) by the ratio (e.g. [D1($k_x$, $k_y$, ω)/D2($k_x$, $k_y$, ω)]), the third extended/corrected frequency and wavenumber data (e.g. D3($k_x$, $k_y$, ω)) being obtained by converting and expressing the newly set third extended/corrected temporal waveform data set with the second wavenumber component and the frequency.

The extension processing more preferably includes causing the computer to execute repeatedly the step (E4) by using a calculation result obtained by multiplying or dividing the third extended/corrected frequency and wavenumber data (e.g. D3($k_x$, $k_y$, ω)) by the ratio (e.g. [D1($k_x$, $k_y$, ω)/D2($k_x$, $k_y$, ω)]) as the processing data, and to determine the calculation result obtained after repeatedly executing the step (E4) a plurality of times as extended data of the first processing data.

A minimum frequency of the frequency can be set to be a half of the maximum frequency or higher.

A data interval of a spatial coordinate component (e.g. the y component) corresponding to the extended second wavenumber component is preferably a fourth or smaller of a wavelength corresponding to the maximum frequency.

When an object to be measured is irradiated with an electromagnetic wave from each of a plurality of transmission antennas arranged at a certain first interval in a first direction, the measurement data is preferably data, which is obtained by causing a reflected wave of the electromagnetic wave reflected from the object to be measured to be received by each reception antenna, which is at a position closest to each of the transmission antennas, among a plurality of the reception antennas. The reception antennas are preferably arranged at the first interval in the first direction and are provided to be shifted in the first direction by a length, which is a half of the first interval, with respect to arrangement of the transmission antennas. A sampling interval of a spatial coordinate component corresponding to the second wavenumber component is preferably a length which is a half of the first interval.

The second wavenumber component preferably includes a wavenumber component (e.g. the ky component) corresponding to a spatial coordinate component (e.g. the y component) in the first direction.

The second wavenumber component preferably includes a wavenumber component (e.g. the kx component) which corresponds to a spatial coordinate component (e.g. the x component) in a second direction that is an in-plane direction of a plane in which the transmission antennas and the reception antennas are provided and is orthogonal to the first direction.

Preferably, the transmission antennas and the reception antennas relatively move with respect to the object to be measured in the second direction.

The first spatial coordinate component (e.g. the z component) is preferably a spatial coordinate component in a normal direction of the plane in which the transmission antennas and the reception antennas are provided.

When all the wavenumber components are set to $k_x$, $k_y$, and $k_z$ and the frequency is set to f, the restraint condition is preferably $k_x^2 + k_y^2 + k_z^2 = 4 \times \varepsilon_r \times (\omega/c_0)^2$, where $c_0$ is speed of light in vacuum, $\varepsilon_r$ is a relative dielectric constant of a medium propagated in the electromagnetic wave, and ω is 2πf.

Another aspect of the technology is a measurement device that measures a wave whose value is fixed by a frequency of the wave generated in a space and a value of a spatial coordinate of the space and performs data processing. The measurement device includes:

a measurement unit that includes a transmission unit which is configured to generate a wave having a frequency changed at a set frequency interval, a reception unit which is configured to receive a response of the wave in the space relating to the wave at a sampling interval, the sampling interval being rougher regarding the second spatial coordinate components of the space than a spatial resolution defined from a maximum frequency of the frequency according to a sampling theorem, the second spatial coordinate components being portions of whole spatial coordinate components of the space except for a first spatial coordinate component, and an acquisition unit which is configured to generate measurement data whose value is fixed by the frequency and a value of the second spatial coordinate component through reception of the reception unit; and a data processing unit which is configured to calculate third processing data whose value is fixed by values of all the spatial coordinate components inside the space from the measurement data.

The data processing unit includes:

a first processor which is configured to calculate first processing data whose value is fixed by a value of a wavenumber component corresponding to the second spatial coordinate component and the frequency by converting the second spatial coordinate component of the measurement data into the wavenumber component;

a second processor which is configured to reconstruct the first processing data by obtaining a first wavenumber component, which corresponds to the first spatial coordinate component, from the frequency and the wavenumber component corresponding to the second spatial coordinate component under a restraint condition among all the wavenumber components corresponding to all the spatial coordinate components inside the space and the frequency, and to calculate second processing data whose value is fixed by values of all the wavenumber components corresponding to all the spatial coordinate components inside the space; and a third processor which is configured to calculate the third processing data whose value is fixed by values of all the spatial coordinate components by converting all the wavenumber components of the second processing data into all the spatial coordinate components.

The second processor is configured to perform extension processing of extending a maximum wavenumber of a second wavenumber component, which corresponds to at least one of the second spatial coordinate components, on the first processing data.

The second processor preferably includes:
a fourth processor configured to generate a corrected temporal waveform data set including corrected temporal waveform data, the corrected temporal waveform data being obtained by correcting temporal waveform data that is generated from the first processing data by converting the second wavenumber component and the frequency of the first processing data into a corresponding spatial coordinate component that corresponds to the second wavenumber component and a time component,
the temporal waveform data being corrected to obtain the corrected temporal waveform data for each value of the corresponding spatial coordinate component by holding only local maximum values
of absolute values of the temporal waveform data along an time axis while assigning a value zero to an area other than data points of the local maximum values; and
a fifth processor which is configured to perform the extension processing using the corrected temporal waveform data set.

The fifth processor preferably includes:
a processor A configured to arrange the corrected temporal waveform data set in a range of the corresponding spatial coordinate component before being extended and a range of the time component before being extended on an extended coordinate space in which the range of the corresponding spatial coordinate component and the range of the time component of the corrected temporal waveform data set are extended, and to generate a first extended/corrected temporal waveform data set including first extended/corrected temporal waveform data in which a value zero is assigned to an extended part on the extended coordinate space;
a processor B configured to generate a second extended/corrected temporal waveform data set including the first extended/corrected temporal waveform data, in which a value zero is assigned every certain interval of the corresponding spatial coordinate component in the first extended/corrected temporal waveform data set;
a processor C configured to generate a ratio between first extended/corrected frequency and wavenumber data and second extended/corrected frequency and wavenumber data,
the first extended/corrected frequency and wavenumber data being obtained by converting and expressing the first extended/corrected temporal waveform data set with a second wavenumber component and the frequency, and
the second extended/corrected frequency and wavenumber data being obtained by converting and expressing the second extended/corrected temporal waveform data set with the second wavenumber component and the frequency; and
a processor D configured to generate a third extended/corrected temporal waveform data set including third extended/corrected temporal waveform data, the third extended/corrected temporal waveform data set being obtained by arranging the corrected temporal waveform data at the certain interval in the corresponding spatial coordinate component on the extended coordinate space and assigning a value zero to a part other than a part in which the corrected temporal waveform data is arranged; and
a processor E configured to extend the first processing data by multiplying or dividing third extended/corrected frequency and wavenumber data by the ratio, the third extended/corrected frequency and wavenumber data being obtained by converting and expressing the third extended/corrected temporal waveform data set with the second wavenumber component and the frequency.

Preferably, the fifth processor further includes:
a processor F configured to obtain processing data by multiplying or dividing the third extended/corrected frequency and wavenumber data by the ratio, and further to obtain processing temporal waveform data by converting and expressing the processing data with the corresponding spatial coordinate component and the time component, and to generate fourth extended/corrected temporal waveform data set from the third extended/corrected temporal waveform data set by assigning a value of the processing temporal waveform data of a part corresponding to a zero-filled part in which the value zero is assigned in the step (E3), to the zero-filled part instead of the value zero in the third extended/corrected temporal waveform data set, and to newly set the fourth extended/corrected temporal waveform data set as the third extended/corrected temporal waveform data set; and
a processor G configured to multiply or divide the third extended/corrected frequency and wavenumber data by the ratio, the third extended/corrected frequency and wavenumber data being obtained by converting and expressing the newly set third extended/corrected temporal waveform data set with the second wavenumber component and the frequency.

The transmission unit preferably includes a plurality of transmission antennas which are configured to emit an electromagnetic wave to an object to be measured and are arranged at a certain first interval in a first direction. The reception unit preferably includes a plurality of transmission antennas which are configured to receive reflected wave of the electromagnetic wave reflected from the object to be measured and are arranged at the first interval in the first direction. The reception antennas are preferably provided to be shifted in the first direction by a length, which is a half of the first interval, with respect to arrangement of the transmission antennas. A sampling interval of a spatial coordinate component corresponding to the second wavenumber component is preferably a length which is a half of the first interval.

Examples of the measurement device include a radar apparatus.

According to the data processing method and the measurement device described above, it is possible to improve the spatial resolution in measurement.

BRIEF DESCRIPTION OF DRAWINGS

FIGS. 9A to 9C are views illustrating an example of the extension processing which is performed in an present embodiment;

DETAILED DESCRIPTION

Figure 1:
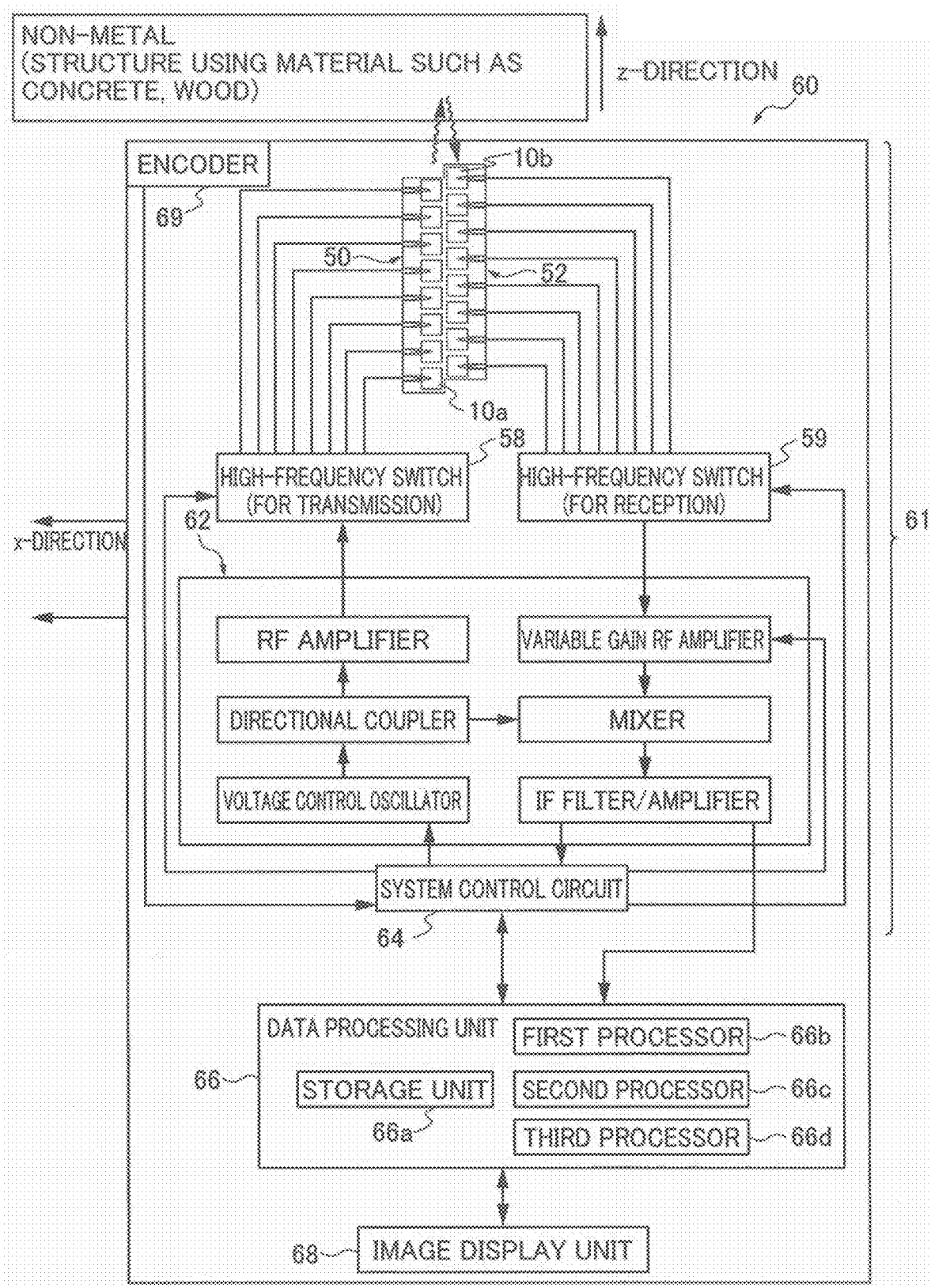
FIG. 1 is a diagram illustrating an exemplary configuration of a radar apparatus according to an embodiment of the present technology.
Figure 2:
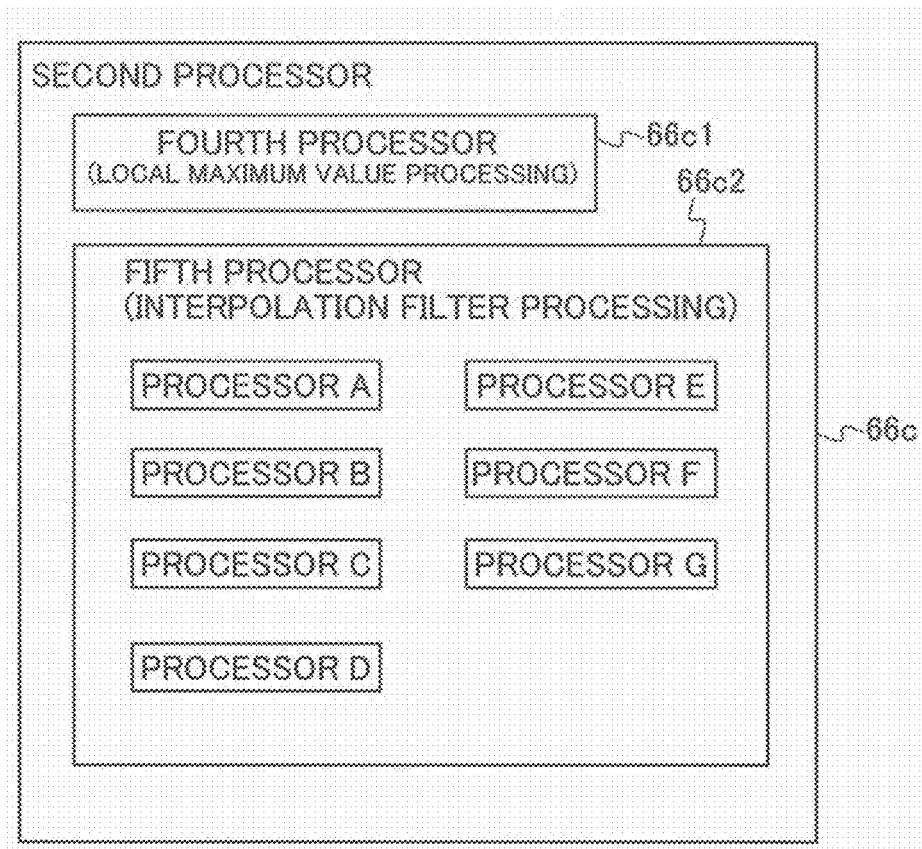
FIG. 2 is a diagram illustrating a configuration of a second processor of a data processing unit illustrated in FIG. 1.
Figure 3:
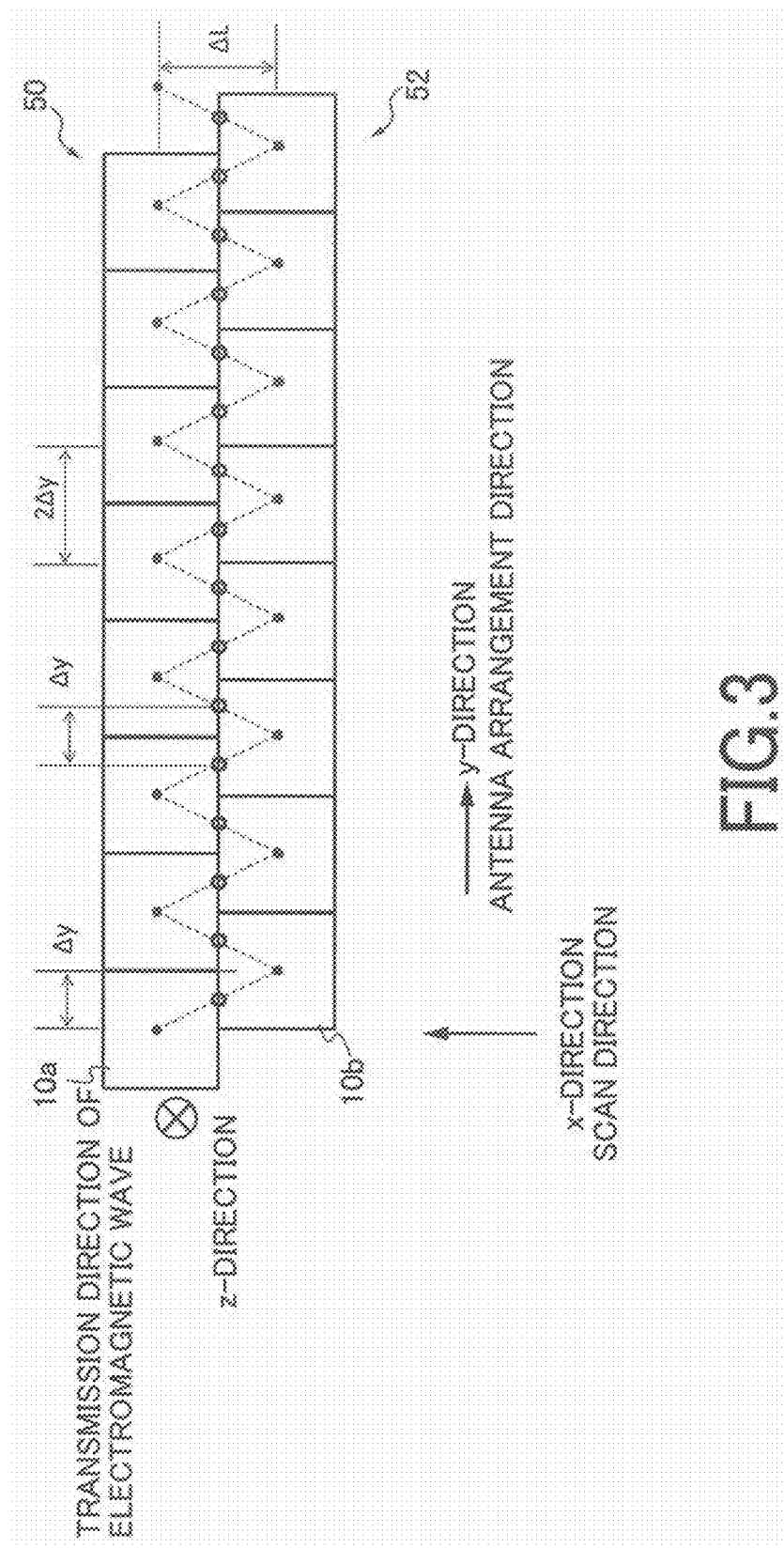
FIG. 3 is a diagram illustrating a configuration of an array antenna illustrated in FIG. 1.
Figure 4:
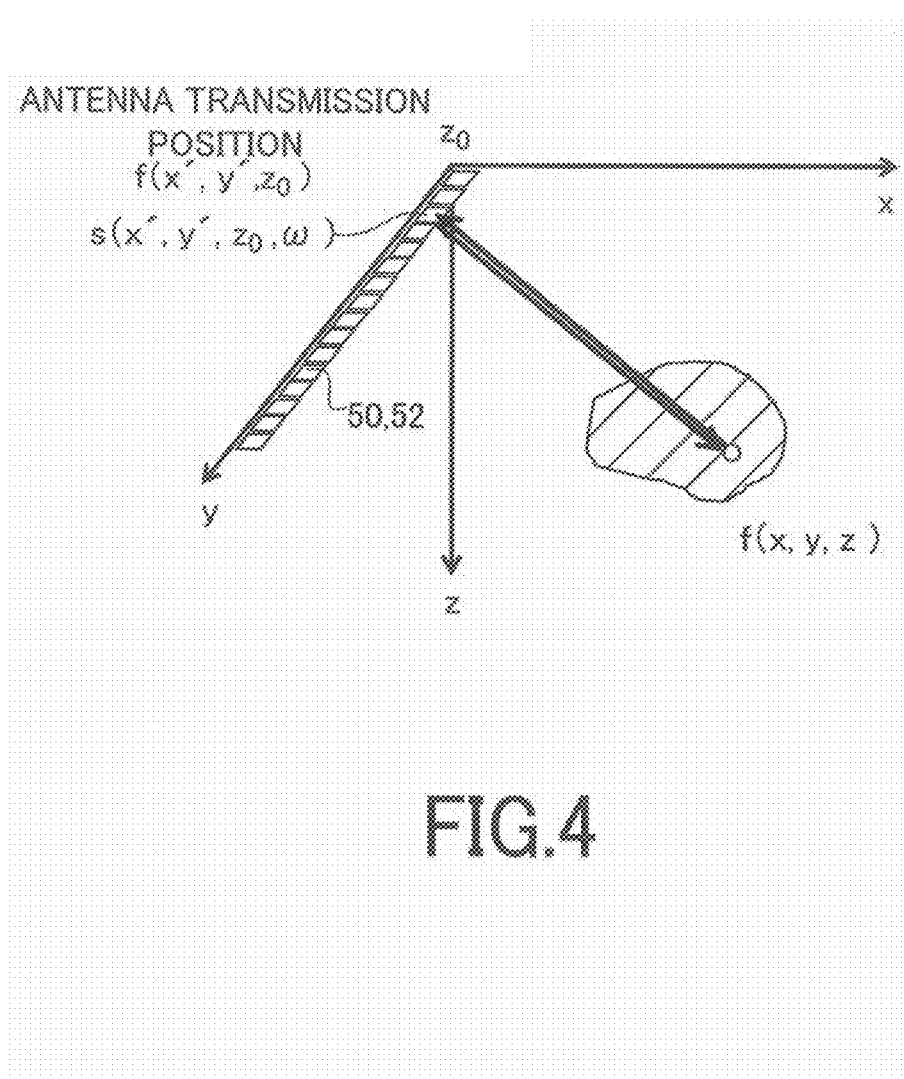
FIG. 4 is a view illustrating a positional relationship between the array antenna and an object to be measured according to an embodiment.

Hereinafter, a data processing method and a measurement device according to an embodiment of the present technology will be described in detail. FIG. 1 is a diagram illustrating an exemplary configuration of a radar apparatus as an aspect of a measurement device. FIG. 2 is a diagram illustrating a configuration of a second processor of a data processing unit illustrated in FIG. 1. FIG. 3 is a diagram illustrating a configuration of an array antenna illustrated in FIG. 1. FIG. 4 is a view for representing a positional relationship between the array antenna and an object to be measured according to an embodiment. Although an electromagnetic wave is described as a wave radiating in a space in the present embodiment, a wave propagated in the space, such as an X-ray and an ultrasonic wave, can be also used instead of the electromagnetic wave.

A radar apparatus 60 according to an embodiment illustrated in FIG. 1 employs a transmission array antenna and a reception array antenna to obtain measurement data by causing an electromagnetic wave to radiate from the transmission antenna and receiving a wave reflected from an object to be measured using the reception antenna while sweeping the electromagnetic wave. The measurement data is data which has an x-coordinate component, a y-coordinate component, a z-coordinate component, and a frequency of the electromagnetic wave as variables. The following data processing is performed on this measurement data to calculate spatial distribution data (third processing data) of reflexibility of the object to be measured. To be specific, (1) The measurement data is subjected to double DFT processing with respect to coordinate components along a plane in which the array antennas are formed, for example, the x-coordinate component and the y-coordinate component (second spatial coordinate components), to calculate first processing data having a kx component and a ky component. The kx component and the ky component are wavenumber components corresponding to the x-coordinate component and the y-coordinate component, as variables.

(2) Next, the first processing data is processed to calculate extended first processing data by extending a range in which at least one of the kx component and the ky component (second wavenumber components) as the variables of the first processing data can vary, that is, extending a maximum wavenumber. The extended first processing data is converted to second processing data by conversion from a frequency or an angular frequency as a variable to a kz component (first wavenumber component), which is a wavenumber component that corresponds to the z-coordinate component (first spatial coordinate component: a coordinate component in a direction orthogonal to the plane in which the transmission array antenna and the reception array antenna are formed).

(3) Thereafter, the second processing data is subjected to triple inverse DFT processing with respect to the kx component, the ky component, and the kz component, to calculate the third processing data which is the spatial distribution data of reflexibility of the object to be measured.

In (2) described above, the extended first processing data obtained by extending the maximum wavenumber is calculated in order to suppress generation of an aliasing component in the third processing data.

In this manner, in the present embodiment, it is possible to shorten at least one measurement interval (sampling interval) of the x-coordinate component and the y-coordinate component of the third processing data when the triple inverse DFT processing is performed. The shortened measurement interval is achieved by extending the range in which at least one of the kx component and the ky component can vary, that is, the maximum wavenumber. The shortened measurement interval is achieved even in the case of sampling a response of the space of the electromagnetic wave with a sampling interval which is rough as compared to the spatial resolution determined from a maximum frequency of frequencies according to a sampling theorem. The response is sampled regarding at least one of the x-coordinate component and the y-coordinate component (second spatial coordinate components) except for the z-coordinate component (first spatial coordinate component) among the spatial coordinate components of the space. Accordingly, it is possible to suppress the generation of the aliasing component. Hereinafter, embodiments will be described in detail using the radar apparatus 60.

(Configuration of Radar Apparatus)

The radar apparatus 60 includes a measurement unit 61, a data processing unit 66, and an image display unit 68. The measurement unit 61 includes a transmission array antenna 50, a reception array antenna 52, high-frequency switches 58 and 59, a high-frequency circuit 62, and a system control circuit 64. The radar apparatus 60 allows the electromagnetic wave of 10 MHz or higher, for example, 10 to 20 GHz to radiate, but a frequency of the electromagnetic wave is not particularly limited thereto.

In the present embodiment, arrangement directions of transmission antennas 10a in the transmission array antenna 50 and reception antennas 10b in the reception array antenna 52 are parallel to each other, and these arrangement directions is set as a y-direction as illustrated in FIG. 3. Meanwhile, each movement direction (scan direction) of the transmission array antenna 50 and the reception array antenna 52 is set as an x-direction as illustrated in FIGS. 1 and 2. A direction (transmission direction of the electromagnetic wave) of the object to be measured when seen from the transmission array antenna 50 and the reception array antenna 52 is set as a z-direction as illustrated in FIGS. 1 and 2.

In the transmission array antenna 50, a plurality of the transmission antennas 10a are arranged in one direction, that is, the y-direction, and the respective transmission antennas 10a causes electromagnetic waves to radiate toward the object to be measured.

In the reception array antenna 52, a plurality of the reception antennas 10b are arranged along the y-direction, which is the arrangement direction of the transmission antennas 10a, and the respective reception antennas 10b receive electromagnetic waves reflected from the object to be measured. The transmission antennas 10a of the transmission array antenna 50 and the reception antennas 10b of the reception array antenna 52 are provided on one plane, and the transmission array antenna 50 and the reception array antenna 52 are arranged such that this plane faces the object to be measured.

The data processing unit 66 processes a plurality of measurement data, obtained by performing transmission toward the object to be measured using the plurality of transmission antennas 10a of the transmission array antenna 50 and reception using the plurality of reception antennas 10b of the reception array antenna 52, thereby calculating image data of the object to be measured. The transmission antennas 10a and the reception antennas 10b according to an embodiment are preferably planar antennas in which an antenna pattern is formed to be planar on a substrate. However, the transmission antennas 10a and the reception antennas 10b are not limited to the planar antennas.

The transmission array antenna 50 and the reception array antenna 52 are configured to move in parallel to a surface of the object to be measured. That is, the transmission array antenna 50 and the reception array antenna 52 perform measurement while scanning along the surface of the object to be measured. When the transmission array antenna 50 and the reception array antenna 52 move, the system control circuit 64 controls an operation of the high-frequency circuit 62 such that the electromagnetic wave radiates while switching the transmission antennas 10a of the transmission array antenna 50 every unit length of a movement distance of the transmission array antenna 50 and the reception array antenna 52 by the high-frequency switch 58. The movement of the transmission array antenna 50 and the reception array antenna 52 is sensed by an encoder 69 which is integrally provided in the substrate in which the transmission array antenna 50 and the reception array antenna 52 are provided and generates a pulse signal every certain movement distance. At this time, a plurality of the receptions of the reception antennas 10b by sequentially switching the plurality of reception antennas 10b every time when the electromagnetic wave radiates from the respective transmission antennas 10a are performed using the high-frequency switch 59.

Incidentally, the electromagnetic wave is caused to radiate while sweeping the frequency of the electromagnetic wave radiating from the transmission array antenna 50 in a range of 10 to 20 GHz, for example, in a certain period of time at a set frequency interval. Accordingly, the measurement data obtained from the high-frequency circuit 62 is data whose value is fixed based on a reception position of the reception antenna 10b and the frequency.

At this time, the operation of the high-frequency switch 59 is controlled such that the reflected wave of the electromagnetic wave on the object to be measured is received by the reception antenna 10b that is the closest to the transmission antenna 10a from which the electromagnetic wave has radiated. A microwave amplifier for reception (RF amplifier) is set such that a gain is changed for each pair of the transmitting transmission antenna 10a and the receiving reception antenna 10b. It is also possible to increase a depth of a defect or the like that can be inspected in the object to be measured by providing a variable gain amplification function capable of switching a gain depending on selection of a pair of the transmission antenna 10a and the reception antenna 10b.

When the number of the arranged reception antennas 10b is increased in the radar apparatus 60, cost of the radar apparatus increases, and further a circuit configuration of the radar apparatus becomes complicated. Thus, it is difficult to increase the number of the arranged reception antenna 10b. Thus, a sampling interval $\Delta y$ (see FIG. 3) of the measurement data, which is a half of an interval $2\Delta y$ (see FIG. 3) of the neighboring reception antennas 10b is large as compared to spatial resolution $\delta y$ (=the minimum wavelength/4=$c_0$/4/$(\varepsilon_r^{1/2} \cdot f_{max})$, where $c_0$ is speed of light in vacuum, and $\varepsilon_r$ is a relative dielectric constant of the object to be measured) that is determined from a maximum frequency $f_{max}$ of a frequency f of the electromagnetic wave according to the sampling theorem (Nyquist's theorem).

In this manner, the radar apparatus 60 is provided with a transmission unit which includes the transmission array antenna 50 and the high-frequency switch 58, a reception unit which includes the reception array antenna 52 and the high-frequency switch 59, and an acquisition unit which includes the high-frequency circuit 62. The transmission unit is configured to generate an electromagnetic wave whose frequency is changed at a set frequency interval. The reception unit is configured to receive a response (reflected wave) of the electromagnetic wave in the space including the object to be measured during the generation of the electromagnetic wave. The acquisition unit is configured to generate measurement data s(x', y', $\omega$) (w is an angular frequency, and $\omega=2\pi f$) whose value is fixed by the frequency f and vales of the x-coordinate component and the y-coordinate component (second spatial coordinate components) through the reception of the reception unit.

The data processing unit 66 processes the measurement data s(x', y', ω), which is obtained by the transmission and reception of the electromagnetic wave using the transmission array antenna 50 and the reception array antenna 52, and generates the third processing data which corresponds to the image data representing the inside of the object to be measured. The data processing unit 66 is, for example, configured in a computer. It is possible to demonstrate a function of the data processing unit 66 by calling out and activating a program stored in a storage unit 66a. That is, the data processing unit 66 can be configured using a software module. An image inside the object to be measured is displayed on the image display unit 68 using the generated image data.

(Data Processing)

FIG. 3 schematically illustrates the transmission array antenna 50 and the reception array antenna 52. Although positions of the transmission antenna 10a and the reception antenna 10b are shifted from each other in the x-direction by ΔL, the positions of the transmission antenna 10a and the reception antenna 10b in the x-direction will be described hereinafter as being present at a point with a circle in the middle between the transmission antenna 10a and the reception antenna 10b in the following description. This point with the circle is referred to as a transmitting and receiving point. Accordingly, a positional relationship among the object to be measured, the transmission array antenna 50, and the reception array antenna 52 can be expressed as illustrated in FIG. 4. Herein, s(x', y', $z_0$, ω) is the measurement data, and $z_0$ is a coordinate value of the transmitting and receiving point in the z-direction which is fixed, and thus, the measurement data will be represented by s(x', y', ω). Further, f(x, y, z) is spatial distribution data of reflexibility of the object to be measured, is the data (third processing data) which is calculated from the measurement data s(x', y', ω) using the data processing unit 66, and corresponds to the image data representing the inside of the object to be measured.

Herein, f(x, y, z) and s(x', y', ω) has a relationship of the following Formula (1).

Formula(1)

$$s(x', y', \omega) = \int\int\int f(x, y, z) e^{ik\sqrt{(x'-x)^2+(y'-y)^2+(Z_0-z)^2}} e^{ik\sqrt{(x'-x)^2+(y'-y)^2+(Z_0-z)^2}} dxdydz$$
$$= \int\int\int f(x, y, z) e^{i2k\sqrt{(x'-x)^2+(y'-y)^2+(Z_0-z)^2}} dxdydz$$

Wherein, k=ω/c (c=$c_0$/$\varepsilon_r^{1/2}$, where $c_0$ is the speed of light in vacuum, and $\varepsilon_r$ is the relative dielectric constant of the object to be measured).

In the above-described Formula (1), the electromagnetic wave is expressed as a spherical wave, and distance attenuation is omitted. The distance attenuation has no influence on the following process, and thus, is omitted. If an exponent part of an integrand of an expression at the second line in the above-described Formula (1) is expressed in the Fourier transform, the following Formula (2) is obtained.

Formula(2)

$$s(x', y', \omega) = \int\int\int f(x, y, z) e^{i2k\sqrt{(x'-x)^2+(y'-y)^2+(Z_0-z)^2}} dxdydz$$
$$= \int\int\int f(x, y, z) \left\{\int\int e^{ik_x(x'-x)+ik_y(y'-y)ik_z(Z_0-z)} dk_x dk_y\right\} dxdydz$$

Herein, kx, ky, and kz are wavenumber components of a wavenumber vector k of the electromagnetic wave, each corresponding to the x-coordinate component, the y-coordinate component, and the z-coordinate component. The wavenumber vector k is the wavenumber vector of an electromagnetic wave propagated while reciprocating between the above-described transmitting and receiving point and a reflection point of the object to be measured. Herein, an exponent part of an expression at the first line and an exponent part of an expression at the second line are the same in the Formula (2), and thus, kx, ky, and kz satisfy an expression of $k_x^2+k_y^2+k_z^2=4k^2(=4\times\varepsilon_r\times(\omega/c_0)^2)$. This expression is a restraint condition to be described later.

Herein, Formula (2) can be simplified as Formula (3).

Formula (3)

$$s(x', y', \omega) = \int\int\int f(x, y, z)\left\{\int\int e^{ik_x(x'-x)+ik_y(y'-y)ik_z(Z_0-z)} dk_x dk_y\right\} dxdydz$$
$$= \int\int\int \left[\left\{\int\int f(x, y, z) e^{-ik_x x-ik_y y-ik_z z} dxdydz\right\} e^{ik_z Z_0}\right] e^{ik_x x'+ik_y y'} dk_x dk_y$$

Herein, an inner part { } of an expression at the second line in the above-described Formula (3) is an expression of the triple Fourier transform relating to x, y, and z. In addition, an outer part of [ ] of an expression at the second line is an expression of the double inverse Fourier transform relating to kx and ky. Thus, when the double Fourier transform is performed on both the sides in relation to x' and y', a function of f(x, y, z) after being subjected to the Fourier transform is set as F(kx, ky, kz), and a function of the measurement data s(x', y', ω) after being subjected to the Fourier transform is set as S(kx, ky, ω), the expression at the second line in the above-described Formula (3) can be written as the following Formula (4).

$$S(k_x, k_y, \omega) = F(k_x, k_y, k_z) e^{j k_z z_{ij}}$$

$$F(k_x, k_y, k_z) = S(k_x, k_y, \omega) e^{-i k_z z_{ij}} \quad \text{Formula (4)}$$

When the triple inverse Fourier transform is performed on both the sides of an expression at the second line in the Formula (4) with respect to kx, ky, and kz, it is possible to obtain the third processing data f(x, y, z), which is a final target, as the following Formula (5).

$$f(x, y, z) = \mathcal{F}^{-1}_{(k_x, k_y, k_z)} \{F(k_x, k_y, k_z)\} \quad \text{Formula (5)}$$

$$= \mathcal{F}^{-1}_{(k_x, k_y, k_z)} \{S(k_x, k_y, \omega) e^{-i k_z z_0}\}$$

Herein, Formula 5 can be simply summarized as the following. Formula (6) by setting the position of the transmitting and receiving point in the z-direction such that $z_0=0$.

$$f(x, y, z) = \mathcal{F}^{-1}_{(k_x, k_y, k_z)} \{S(k_x, k_y, \omega) e^{-i k_z z_0}\} \quad \text{Formula (6)}$$

$$= \mathcal{F}^{-1}_{(k_x, k_y, k_z)} \{S(k_x, k_y, \omega)\}$$

That is, the third processing data f(x, y, z) is calculated, in the data processing according to the present embodiment, by performing the double Fourier transform on the measurement data s(x', y', ω) with respect to x and y, then, converting kx, ky and ω into the kz component using the angular frequency ω under the restraint condition of $kx^2+ky^2+kz^2=4k^2$ ($=4\times\varepsilon_r\times(\omega/c_0)^2$)), and performing the triple inverse Fourier transform on the converted result in relation to the kx component, the ky component, and the kz component. This data processing is implemented by the data processing unit 66.

To be specific, the data processing unit 66 is provided with a first processor 66b, a second processor 66c, and a third processor 66d, and is configured to calculate f(x, y, z) whose value is fixed by values of the x-coordinate component, the y-coordinate component, and the z-coordinate component, which are all the spatial coordinate components inside the space, from the measurement data s(x', y', ω). The second processor 66c is provided with a fourth processor 66c1 and a fifth processor 66c2 as illustrated in FIG. 2. The fourth processor 66c1 is a portion that performs local maximum value processing in the extension processing of the first processing data to be described later. The fifth processor 66c2 is a portion that performs interpolation filter processing in the extension processing performed at the time of reconstructing the first processing data to be described later, and is provided with processors A to G in detail.

The first processor 66b is configured to calculate first processing data S(kx, ky, ω) by converting the x-coordinate component and the y-coordinate component (second spatial coordinate components) of the measurement data s(x', y', ω) into the kx component and the ky components as the wavenumber components. That is, the first processing data S(kx, ky, ω) is a wavenumber conversion result of the measurement data s(x', y', ω), and the value of the S(kx, ky, ω) is fixed by values of the positive and negative kx component and ky component corresponding to the x-coordinate component and the y-coordinate component, and the angular frequency ω (or the frequency f). In the present embodiment, the x-coordinate component, the y-coordinate component, and the angular frequency ω or the frequency f are the variables taking discrete values, and thus, a discrete Fourier transform (DFT) is used as the Fourier transform or the wavenumber conversion. In addition, the inverse DFT is used as the inverse Fourier transform.

The second processor 66c is configured to calculate second processing data S'(kx, ky, kz) whose value is fixed by values of the kx component, the ky component, and the kz component corresponding to all the spatial coordinate components inside the space by reconstructing the first processing data S(kx, ky, ω). The kz component is obtained from the angular frequency ω (or the frequency f), the kx component, and the ky component under the restraint condition ($k_x^2 + k_y^2 + k_z^2 = 4\times\varepsilon_r\times(\omega/c_0)^2$) among the kx component, the ky component, and the kz component, which are all the wavenumber components corresponding to all the spatial coordinate components inside the space, and the angular frequency ω (or the frequency f). Details of the above-described reconstruction will be described later.

The third processor 66d is configured to calculate the third processing data f(x, y, z) by converting all the wavenumber components of the second processing data S'(kx, ky, kz) into all the spatial coordinate components (the triple inverse Fourier transform). The value of the f(x, y, z) is fixed by values of all the spatial coordinate components (the x-coordinate component, the y-coordinate component, and the z-coordinate component)

(Reconstruction of First Processing Data)

A value of the kz component, which satisfies the above-described restraint condition with respect to a value of the kx component, a value of the ky component, and a value of ω of the first processing data S(kx, ky, ω), is obtained in the reconstruction, which is performed for the calculation of the second processing data performed by the second processor 66c.

Herein, the values of the kx component, the ky component, and ω are represented by discrete values. For example, a positive kx component is represented as $kx = n_{kx}/(N_{kx}/2) \, kx_{max}$, a negative kx component is represented as $kx = (n_{kx} - N_{kx})/(N_{kx}/2) kx_{max}$, a positive ky component is represented as $ky = n_{ky}/(N_{ky}/2) ky_{max}$, a negative ky component is represented as $ky = (n_{ky} - N_{ky})/(N_{ky}/2) ky_{max}$, and ω is represented as $\omega = (nf/Nf) 2\pi f_{max}$.

Herein, $N_{kx}$ and $N_{ky}$ are the number of measurement points of each of the x-coordinate component and the y-coordinate component. Further, $n_{kx}$ is an integer that is 0 or larger and smaller than $N_{kx}$, and $n_{ky}$ is an integer that is 0 or larger and smaller than $N_{ky}$, which are discrete value parameters which determine values of the kx component and the ky component. Assuming that $N_{kx}$ and $N_{ky}$ are even numbers, the positive kx component and ky component correspond to that $n_{kx}$ is 1 or larger and $N_{kx}/2$ or smaller and $n_{ky}$ is 1 or larger and $N_{ky}/2$ or smaller, and the negative kx component and ky component correspond to that $n_{kx}$ is $N_{kx}/2+1$ or larger and smaller than $N_{kx}$, and $n_{ky}$ is $N_{ky}/2+1$ or larger and smaller than $N_{ky}$. Further, $kx_{max}$ and $ky_{max}$ are the respective maximum wavenumbers of the kx component and the ky component, and are $\pi/\Delta x$ and $\pi/\Delta y$ which are determined based on the sampling theorem. Herein, $\Delta x$ is a sampling interval (measurement interval) in the x-direction (scan direction) illustrated in FIG. 3. Further, $\Delta y$ is a sampling interval (measurement interval) in the y-direction. Further, $f_{max}$ is the maximum frequency of the electromagnetic wave, $N_f$ is a measurement number of the frequency, and $n_f$ is an integer that is 1 or larger and $N_f$ or smaller and is a discrete value parameter that determines the value of ω.

Herein, when the frequency of the radiating electromagnetic wave is in a specific frequency band, $n_f$ corresponding to the specific frequency band is a part of integers of 1 or larger and $N_f$ or smaller.

The kz component is also subjected to the inverse DFT processing as described above, and thus, a positive kz component is represented as $kz=n_{kz}/(N_{kz}/2)kz_{max}$, and a negative kz component is represented as $kz=(n_{kz}-N_{kz})/(N_{kz}/2)kz_{max}$. Herein, $N_{kz}$ is a sampling number of the z-coordinate component. Further, $n_{kz}$ is an integer that is 0 or larger and smaller than $N_{kz}$, and is a discrete value parameter that determines the value of the kz component. Assuming that $N_{kz}$ is an even number, the positive kz component corresponds to that $n_{kz}$ is 1 or larger and $N_{kz}/2$ or smaller, and the negative kz component corresponds to that $n_{kz}$ is $N_{kz}/2+1$ or larger and smaller than $N_{kz}$. Further, $kz_{max}$ is a maximum wavenumber of the kz component and is $\pi/\Delta z$ which is determined based on the sampling theorem. Herein, $\Delta z$ is a data interval in the z-direction illustrated in FIG. 3. This data interval $\Delta z$ can be expressed as $c/(4 \Delta f)/N_{kz}$ when considering a maximum range of the z-direction determined as $c/(4 \Delta f)$. Incidentally, the sampling number $N_{kz}$ in the z-direction can be suitably set, but is preferably twice or more of $N_f$ as will be described later.

In this manner, the value of the kx component, the value of the ky component, the value of $\omega$, and the value of the kz component are discretized, and thus, it is difficult to determine the discrete value parameter $n_{kz}$, which corresponds to the kz component, as the integer at the time of converting $\omega$ to kz. Thus, it is preferable to set a value of the discrete value parameter $n_{kz}$ as an integer from 0 to $N_{kz}$ in order, and at this time, calculate a value of $\omega$ obtained under the restraint condition using a value of the kx component and a value of the ky component, and calculate a value of the first processing data $S(kx, ky, \omega)$ based on the calculated value of $\omega$, the value of the kx component, and the value of the ky component using interpolation of the first processing data $S(kx, ky, \omega)$.

Figure 5:
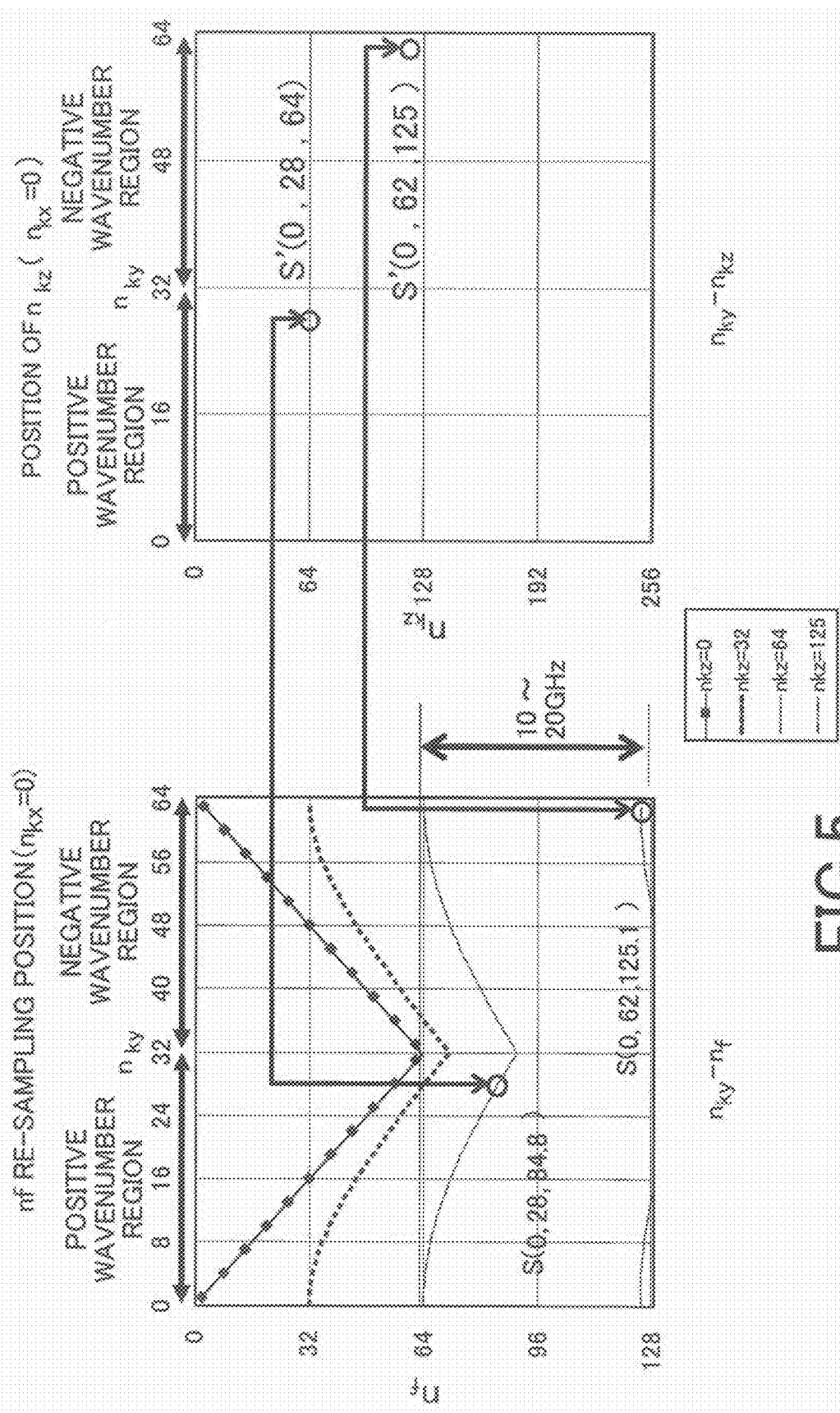
FIG. 5 is a view illustrating an example of conversion from an angular frequency ω to a kz component which is performed in data processing.

FIG. 5 is a view illustrating an example of conversion from $\omega$ to kz. In FIG. 5, the value of the kx component, the value of the ky component, and the value of the kz component of the second processing data $S'(kx, ky, kz)$ are substituted by the corresponding values of $n_{kx}$, $n_{ky}$, and $n_{kz}$, and the value of the kx component, the value of the ky component, and the value of $\omega$ of the first processing data $S(kx, ky, \omega)$ are substituted by values of $n_{kx}$, $n_{ky}$, and $n_f$. In one example illustrated in FIG. 5, $n_{kx}=0$, $n_{ky}=28$, and $n_f=84.8$ correspond to $n_{kx}=0$, $n_{ky}=28$, and $n_{kz}=64$. In another example, $n_{kx}=0$, $n_{ky}=62$, and $n_f=125.1$ correspond to $n_{kx}=0$, $n_{ky}=62$, and $n_{kz}=125$. Accordingly, a value of the first processing data $S(kx, ky, \omega)$ in the case where $n_{kx}=0$, $n_{ky}=28$, and $n_f=84.8$ is calculated by performing the interpolation using a value of the first processing data $S(kx, ky, \omega)$ in a case where $n_{kx}=0$, $n_{ky}=28$, and $n_f=85$ and a value of the first processing data $S(kx, ky, \omega)$ in a case where $n_{kx}=0$, $n_{ky}=28$, and $n_f=84$. A value of the first processing data $S(kx, ky, \omega)$ in the case where $n_{kx}=0$, $n_{ky}=62$, $n_f=125.1$ is also calculated using the same method.

Figure 6A:
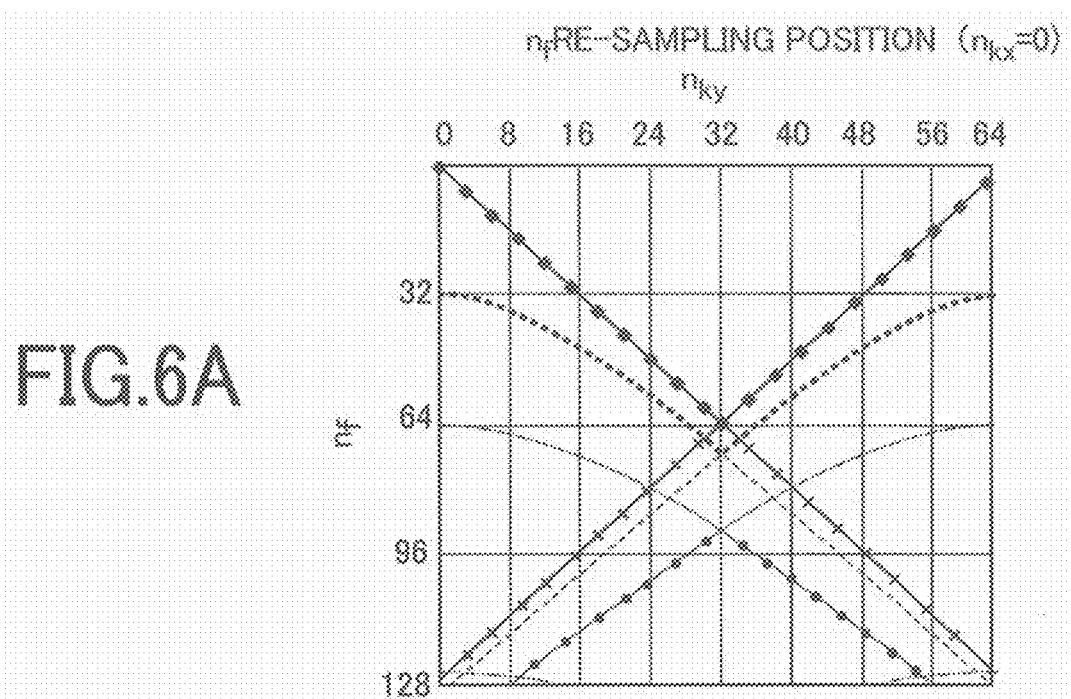
FIGS. 6A and 6B are graphs illustrating a portion in which an aliasing component is generated.
Figure 6B:
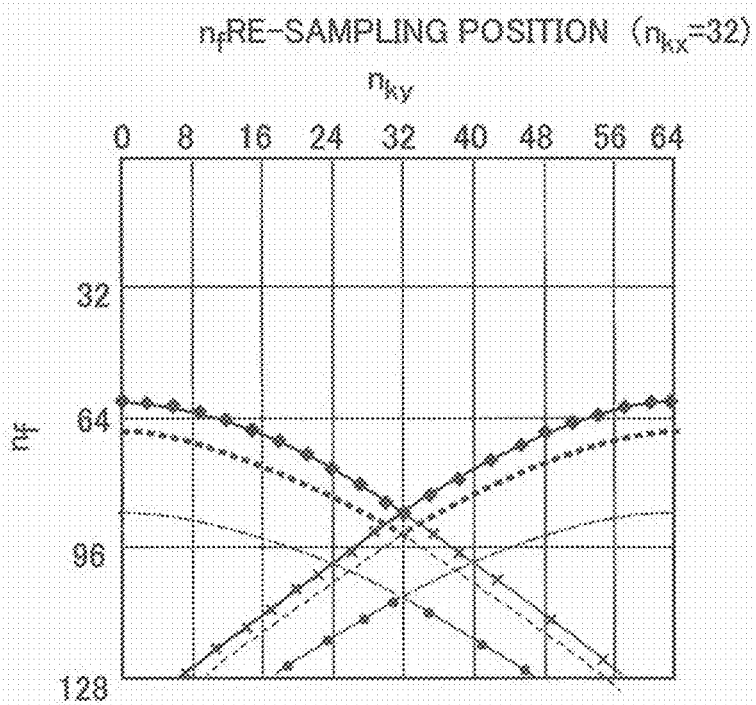

However, the second processing data $S'(kx, ky, kz)$ reconstructed by such conversion from $\omega$ to kz causes generation of aliasing in the third processing data $f(x, y, z)$ when the triple inverse DFT processing is performed on the second processing data $S'(kx, ky, kz)$. FIGS. 6A and 6B are graphs illustrating a portion in which the aliasing is generated. An aliasing component in the data is noise that a frequency component, lower than an actual frequency, appears when the number of sampling points (the number of measurement points) is small. In FIGS. 6A and 6B, it is assumed that $N_{ky}$ is 64, $N_f$ is 128, the ky component is 0 when $n_{ky}=0$, the ky component is a maximum value when $n_{ky}$ is 32, a region of $n_{ky}=1$ to 32 is a positive region of the ky component where the ky component gradually increases along with an increase of $n_{ky}$, and a region of $n_{ky}=33$ to 63 is a negative region of the ky component where the negative ky component gradually increases to approach zero along with the increase of $n_{ky}$. That is, $ky=n_{ky}/(N_{ky}/2)ky_{max}$ is set for the positive ky component, and $ky=(n_{ky}-N_{ky})/(N_{ky}/2)ky_{max}$ is set for the negative ky component.

FIGS. 6A and 6B illustrate a relationship between $n_{ky}$ and $n_f$, which are restrained by the above-described restraint condition, obtained by varying $n_{kz}$ when assuming $n_{kx}=0$ and 32. The value of the ky component becomes the maximum when $n_{ky}=32$, and the value of the ky component becomes the negative minimum when $n_{ky}=33$. Thus, an extended portion in which curves or straight lines indicating a relationship between $n_{ky}$ and $n_f$ cross each other at $n_{ky}=32$ and further extend beyond the crossing point, indicates that an absolute value of the ky component exceeds $ky_{max}$, and data of the extended portion becomes the aliasing component.

The generation of the aliasing component is caused when the response of the space of the electromagnetic wave is sampled at the sampling interval rougher than the spatial resolution which is determined according to the sampling theorem from the maximum frequency $f_{max}$ of the frequency, for the y-coordinate component. Accordingly, when the rough sampling for the y-coordinate component is performed, the extension of the wavenumber is performed for the first processing data $S(kx, ky, \omega)$ in order to suppress the generation of the aliasing component in the third processing data $f(x, y, z)$ in the present embodiment. In the following description, the case of extending the maximum wavenumber of the ky component from $ky_{max}$ to $2\, ky_{max}$ will be mainly described in order to facilitate the understanding. However, the following method can be applied to not only the extension of the maximum wavenumber of the ky component but also extension of a maximum wavenumber of the kx component, and further, can be applied to a case of simultaneously extending the maximum wavenumbers of the kx component and the ky component.

In the present embodiment, the reconstruction is performed using the extended first processing data.

(Extension of First Processing Data)

Figure 7:
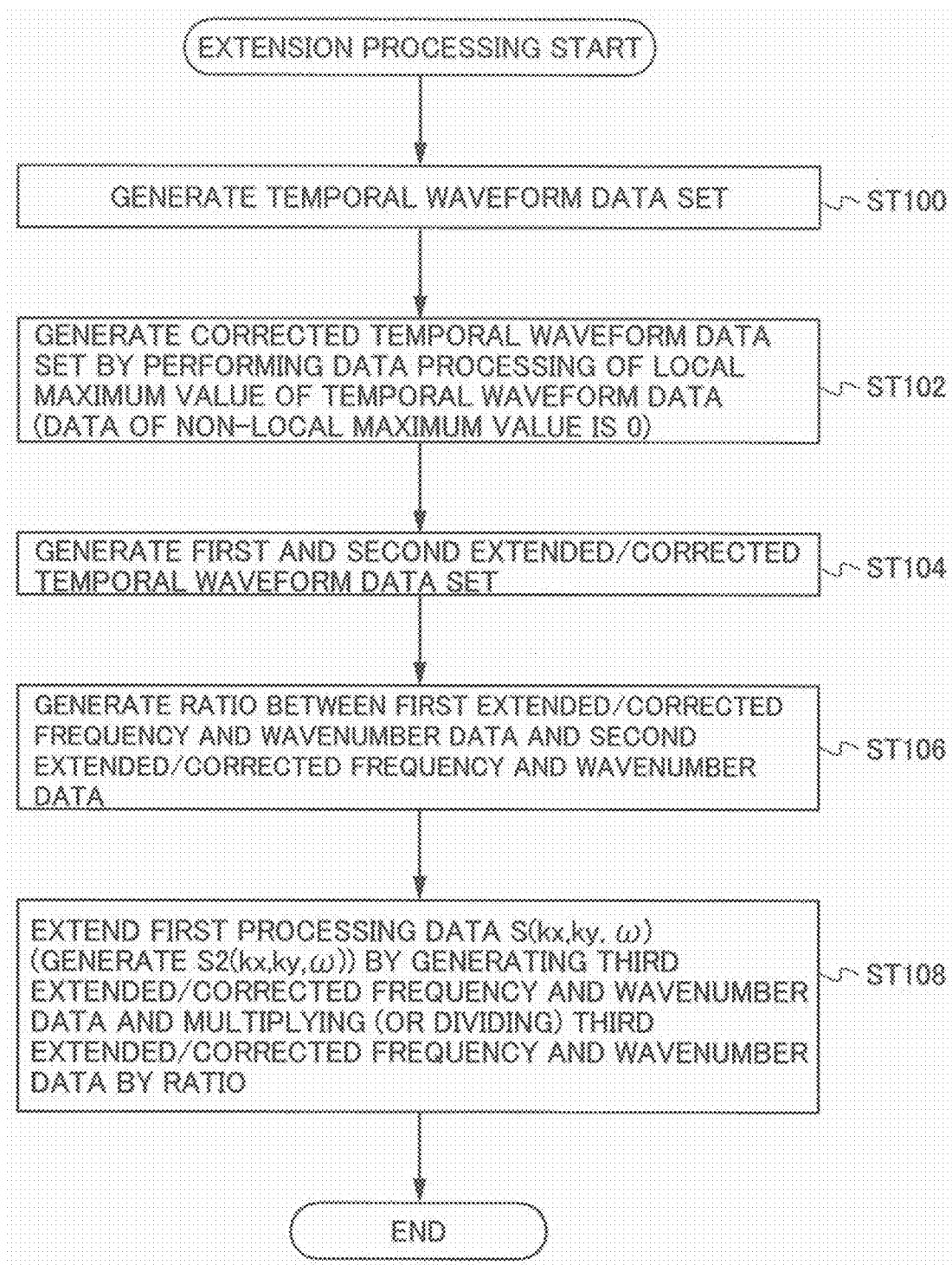
FIG. 7 is a view illustrating an exemplary flow of extension processing which is performed in an embodiment.

FIG. 7 is a view illustrating an exemplary flow of the extension processing of the first processing data.

As illustrated in FIG. 7, the extension processing includes the local maximum value processing which is performed in Steps ST100 to 102 and the interpolation filter processing which is performed in Steps ST104 to 108.

First, a temporal waveform data set including temporal waveform data whose waveform is provided for each of value of the y-coordinate component is generated by performing double inverse DFT processing on the first processing data $S(kx, ky, \omega)$ in order to convert a set of the ky component and the frequency into a set of the y-coordinate component and a time component (Step ST100). The ky component is intended for extending the maximum wavenumber of the first processing data $S(kx, ky, \omega)$.

Next, a corrected temporal waveform data set including corrected temporal waveform data whose waveform is provided for each value of the y-coordinate component. In the corrected waveform data, only values of data points of a local maximum values of absolute values of the temporal waveform data on a time base is held, and values other than the value of the data point of the local maximum value are set as zero (Step ST102). The corrected waveform data is generated for each value of the y-coordinate component, in the generated temporal waveform data set.

The fourth processor 66c1 illustrated in FIG. 2 performs Steps ST100 and ST102.

Figure 8A:
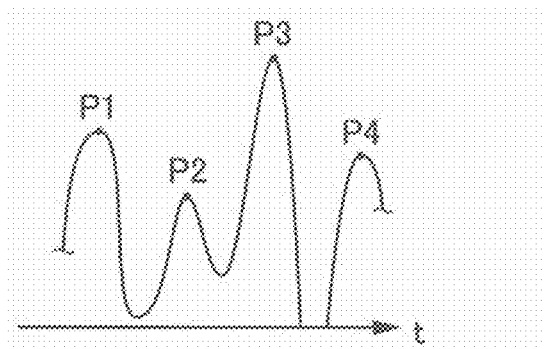
FIGS. 8A and 8B are graphs illustrating an example of local maximum value processing which is performed during the extension processing which is performed in an embodiment.
Figure 8B:
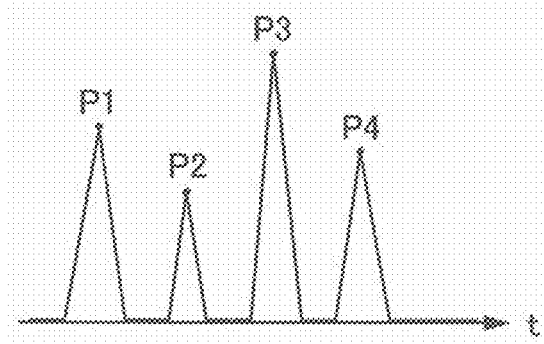

FIGS. 8A and 8B are graphs illustrating an example of the local maximum value processing which is performed in Step ST102.

FIG. 8A illustrates a waveform of the absolute value of the temporal waveform data. Herein, the temporal waveform data has a real part and an imaginary part since the double inverse DFT processing is performed on the first processing data S(kx, ky, ω). In FIG. 8A, data points P1 to P4 of the local maximum values are present in the waveform of the absolute value of the temporal waveform data. In this case, the fourth processor 66c1 generates a corrected temporal waveform illustrated in FIG. 8B by holding values (values of each rear part and each imaginary part) the of the data points P1 to P4 of the maximum values and setting values other than the values of the data points P1 to P4 as zero.

It is possible to extract information on the low frequency, which is a minimum frequency or lower, by generating such a corrected temporal waveform even when the minimum frequency of the frequency is a half the maximum frequency $f_{max}$ or higher, for example, when the minimum frequency is 10 GHz or higher for the maximum frequency of 20 GHz. This point will be described later.

Next, the fifth processor 66c2 performs Steps ST104 to ST108 illustrated in FIG. 7.

That is, the fifth processor 66c2 is configured to perform the extension processing using the corrected temporal waveform data set which is generated in Step ST102.

FIGS. 9A to 9C are views illustrating an example of the extension processing.

FIG. 9A illustrates an example of processing the corrected temporal waveform data set. As illustrated in FIG. 9A, the corrected temporal waveform data is represented by a corrected temporal waveform data set d including corrected temporal waveform data $d_{ij}$ (i is a number indicating the position of the y-coordinate component and is a natural number among 1 to M, and j is a number indicating time and is a natural number among 1 to N) of times $t_1$ to $t_N$ for each position of the y-coordinate component y=$y_1$ to $y_M$.

A processor A of the fifth processor 66c2 arranges the corrected temporal waveform data set in a range of 1 to M of the y-coordinate component before being extended and a range of 1 to N of the time component before being extended on an extended coordinate space. In the extended coordinate space, the range of the y-coordinate component (corresponding spatial coordinate component) of the corrected temporal waveform data set d and the range of the time component are extended from 1 to M and 1 to N, respectively, to 1 to 2·M and 1 to 2·N. By such arrangement, a first corrected temporal waveform data set d1 including first corrected temporal waveform data is generated. FIG. 9B illustrates an example of corrected temporal waveform data $d_{ij}$ arranged in the first corrected temporal waveform data set d1. The first corrected temporal waveform data set d1 is referred to as a first extended/corrected temporal waveform data set. Hereinafter, results of extension processing of the second, the third, or the fourth corrected temporal waveform data sets are also referred to as the second, the third, or the fourth extended/corrected temporal waveform data set. Further, a processor B of the fifth processor 66c2 generates a second extended/corrected temporal waveform data set, obtained by setting values of the first extended/corrected temporal waveform data as zero, at a certain interval, for example, every other one, of the y-coordinate components (corresponding spatial coordinate components) among the first extended/corrected temporal waveform data in the generated first extended/corrected temporal waveform data set. FIG. 9C illustrates an example of a second extended/corrected temporal waveform data set d2.

In this manner, the processor A generates the first extended/corrected temporal waveform data set d1, and the processor B generates the second extended/corrected temporal waveform data set d2 (Step ST104).

Next, a processor C of the fifth processor 66c2 generates a ratio between the first extended/corrected frequency and wavenumber data D1(kx, ky, ω) and the second extended/corrected frequency and wavenumber data D2(kx, ky, ω) (Step ST106). The first extended/corrected frequency and wavenumber data D1(kx, ky, ω) that is expressed by the kx component, the ky component (second wavenumber component) and the frequency is obtained by performing the double DFT processing on the first extended/corrected temporal waveform data set d1. The second extended/corrected frequency and wavenumber data D2(kx, ky, ω) that is expressed by the kx component, the ky component (second wavenumber component) and the frequency is obtained by performing the double DFT processing on the second extended/corrected temporal waveform data set d2. When a value of the ratio at this time is one or more, the value is set to one.

Further, a processor D of the fifth processor 66c2 generates a third extended/corrected temporal waveform data set d3 including third extended/corrected temporal waveform data d3 by arranging the corrected temporal waveform data $d_{ij}$ at a certain interval, for example every other one, of the y-coordinate components (corresponding spatial coordinate components) on the extended coordinate space, that is, in the extended range of 1 to 2·M of the y-coordinate component and the extended range of 1 to 2·N of the time component, and assigning the value 0 to a portion other than the portion in which the corrected temporal waveform data $d_{ij}$ is arranged.

Figures 10, 11:
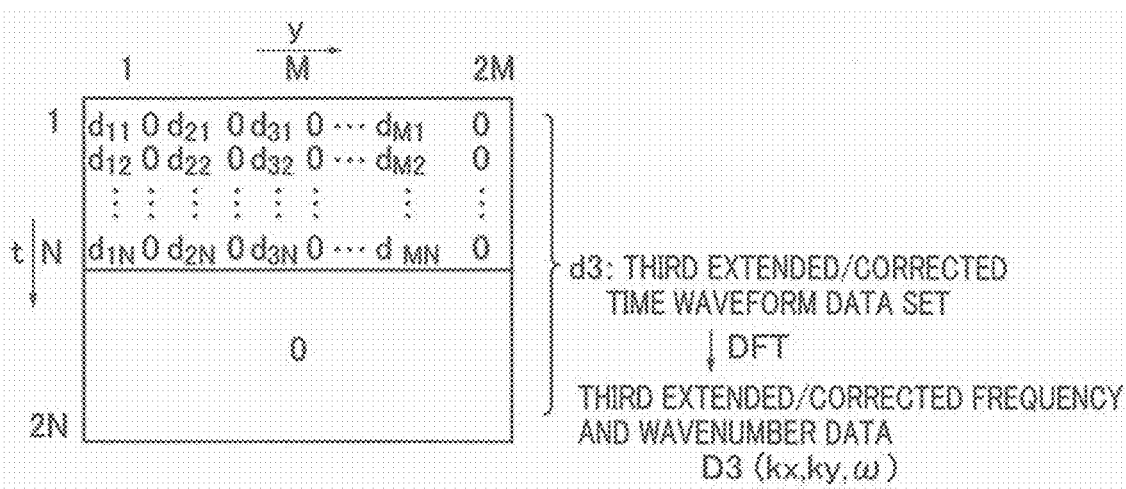
FIG. 10 is a view illustrating an example of processing a corrected temporal waveform data set which is performed in an present embodiment.
FIG. 11 is a view illustrating an example of calculation of third extended/corrected frequency/wavenumber data and a generated ratio in an embodiment.

FIG. 10 is a view illustrating an example of processing the corrected temporal waveform data set and illustrates an example of the third extended/corrected temporal waveform data set d3.

A processor E of the fifth processor 66c2 generates third extended/corrected frequency and wavenumber data D3(kx, ky, ω) that is expressed by the kx component, the ky component (second wavenumber component) and the frequency by performing the double DFT processing on the third extended/corrected temporal waveform data set d3.

Further, the processor E multiplies or divides the third extended/corrected frequency and wavenumber data D3(kx, ky, ω) by the ratio generated in Step ST106 or by the processor C. FIG. 11 is a view illustrating an example of calculation of the third extended/corrected frequency and wavenumber data D3(kx, ky, ω) and the ratio generated in Step ST106. In FIG. 11, the ratio is [D1(kx, ky, ω))/D2(kx, ky, ω)], and the ratio is multiplied (subjected to multiplication) by the third extended/corrected frequency and wavenumber data D3(kx, ky, ω). If the ratio is [D2(kx, ky, ω))/D1(kx, ky, ω)], the third extended/corrected frequency and wavenumber data D3(kx, ky, ω) is divided (subjected to division) by the ratio.

In this manner, extended first processing data $S_2$(kx, ky, ω) obtained by extending the first processing data is generated (Step ST108).

The ratio, which is used for generation of the extended first processing data $S_2$(kx, ky, ω) in this manner, is [D1(kx, ky, ω))/D2(kx, ky, ω)] in the case illustrated in FIG. 11. This ratio represents a change between the second extended/corrected frequency and wavenumber data D2(kx, ky, ω) and the first extended/corrected frequency and wavenumber data D1(kx, ky, ω). D2(kx, ky, ω) is generated from the second extended/corrected temporal waveform data set d2 in which the corrected temporal waveform data $d_{ij}$ are arranged at every other position in the range of the y-coordinate component and the time component before being extended. The D1(kx, ky, ω) is generated from the first extended/corrected temporal waveform data set d1 in which the corrected temporal waveform data $d_{ij}$ arranged as a package in the range of the y-coordinate component and the time component before being extended on the extended coordinate space. Accordingly, the ratio functions as a filter. This filter represents a change in generation of the aliasing component that is caused by extending the coordinate space. Thus, it is possible to analogize the extended first processing data $S_2$(kx, ky, ω) on the extended coordinate space in which the aliasing component is suppressed by multiplying the third extended/corrected frequency and wavenumber data D3(kx, ky, ω) by the ratio. D3(kx, ky, ω) is generated from the third extended/corrected temporal waveform data set d3 in which the corrected temporal waveform data $d_{ij}$ are arranged at every other position in the extended range of the y-coordinate component on the extended coordinate space. At this time, the calculation as illustrated in FIG. 11 is performed using the above-described ratio, and accordingly, a non-zero value is generated in data in which 0 is arranged between the neighboring corrected temporal waveform data $d_{ij}$ as illustrated in FIG. 10. This non-zero value can be obtained by performing the double inverse DFT processing on the extended first processing data $S_2$(kx, ky, ω).

In this manner, the maximum wavenumber among the wavenumbers is extended by generating the waveform data of the y-coordinate component through interpolation using the ratio having the filter function that suppresses generation of the aliasing component in the extension processing according to the present embodiment, and thus, the ratio is also referred to as an interpolation filter.

The aliasing component is not sufficiently removed in some cases only by applying such an interpolation filter once. Thus, the interpolation filter is preferably applied a plurality of times in the present embodiment as will be described hereinafter.

Figures 12A, 12B:
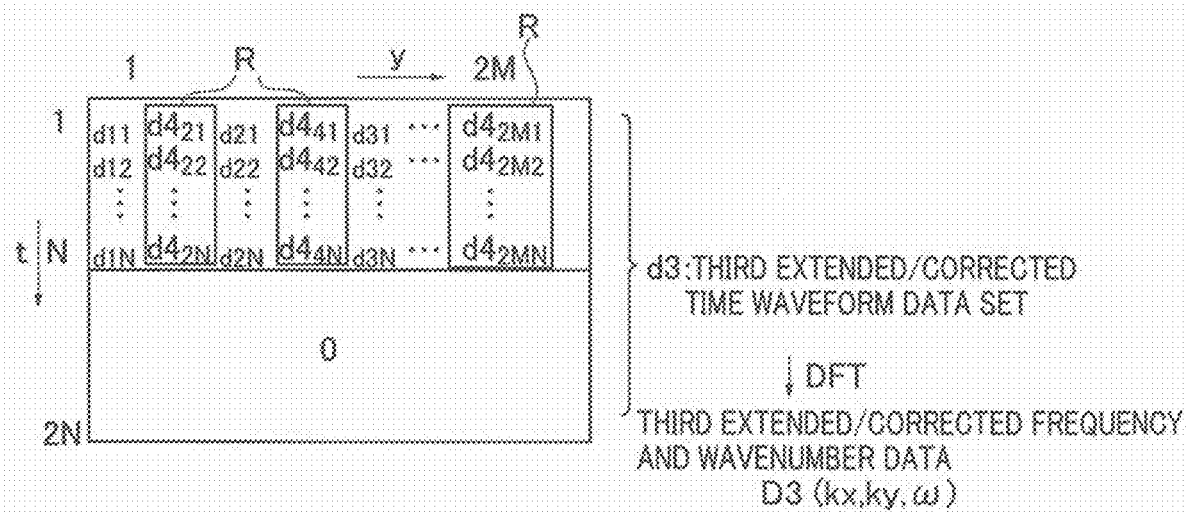
FIGS. 12A and 12B are views illustrating an example in which an interpolation filter is applied a plurality of times that is performed in an embodiment.

FIGS. 12A and 12B are views illustrating an example in which the interpolation filter is applied a plurality of times. This processing is performed by processors F and G of the fifth processor 66c2.

As illustrated in FIG. 12A, a processing temporal waveform data set, which is obtained by performing the double DFT processing on a result of multiplication of the ratio [D1(kx, ky, ω)/D2(kx, ky, ω)] and the third extended/corrected frequency and wavenumber data D3(kx, ky, ω), is set as fourth extended/corrected temporal waveform data d4 including fourth extended/corrected temporal waveform data $d4_{ij}$. At this time, a non-zero value is generated in a part R in the fourth extended/corrected temporal waveform data set d4 as illustrated in FIG. 12B, which corresponds to zero-filling areas (see FIG. 10), each of which is filled with a value zero between each arrangement of the corrected temporal waveform data of the third extended/corrected temporal waveform data set d3. The processor F of the fifth processor 66c2 generates an extended/corrected temporal waveform data set by assigning values of the processing time waveform data $d4_{ij}$ in the part R corresponding to the zero-filling areas, instead of the value zero, in the zero-filling areas of the third extended/corrected temporal waveform data set d3. The processor F generates the extended/corrected temporal waveform data set as a new third extended/corrected temporal waveform data set d3. That is, the processor F generates the third extended/corrected temporal waveform data set d3 again.

Next, the processor G of the fifth processor 66c2 multiplies or divides the third extended/corrected frequency and wavenumber data D3(kx, ky, ω) by the ratio [D1(kx, ky, ω)/D2(kx, ky, ω)]. D3(kx, ky, ω) is expressed by the kx component, the ky component (second wavenumber component) and the frequency and is obtained by performing the double DFT processing on the newly generated third extended/corrected temporal waveform data set d3.

In this manner, the ratio, that is, the interpolation filter can be used twice.

Further, it is also possible to generate the third extended/corrected frequency and wavenumber data D3(kx, ky, ω) again in the processor G by applying a result of the calculation of the third extended/corrected frequency and wavenumber data D3(kx, ky, ω) and the ratio in the expression illustrated in FIG. 12A to generate the fourth extended/corrected temporal waveform data set d4 again, and performing the process of assigning the value of the part R of this generated fourth extended/corrected temporal waveform data set d4 to the part R of the third extended/corrected temporal waveform data set d3 again. The third extended/corrected frequency and wavenumber data D3(kx, ky, ω) generated in this manner can be further subjected to calculation according to the expression illustrated in FIG. 12A.

In this manner, the ratio, that is, the interpolation filter can be repeatedly used a plurality of times.

Accordingly, it is possible to suppress the generation of the aliasing component. The number of times of application of the ratio, that is, the interpolation filter may be a predetermined number. In addition, the ratio, that is, the interpolation filter processing may be repeatedly performed until a level of the aliasing component included in a result obtained by multiplication or division between the third extended/corrected frequency and wavenumber data D3(kx, ky, ω) and the ratio [D1(kx, ky, ω)/D2(kx, ky, ω)] fits within a predetermined range.

Figure 13A:
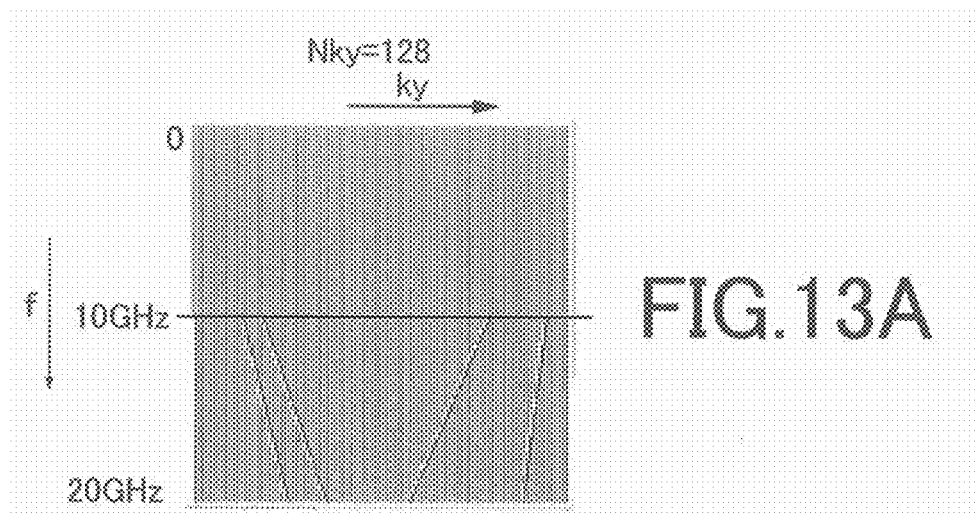
FIGS. 13A and 13B are graphs illustrating an example of data in a ky-f coordinate space of a ky component and a frequency f created by simulation.
Figure 13B:
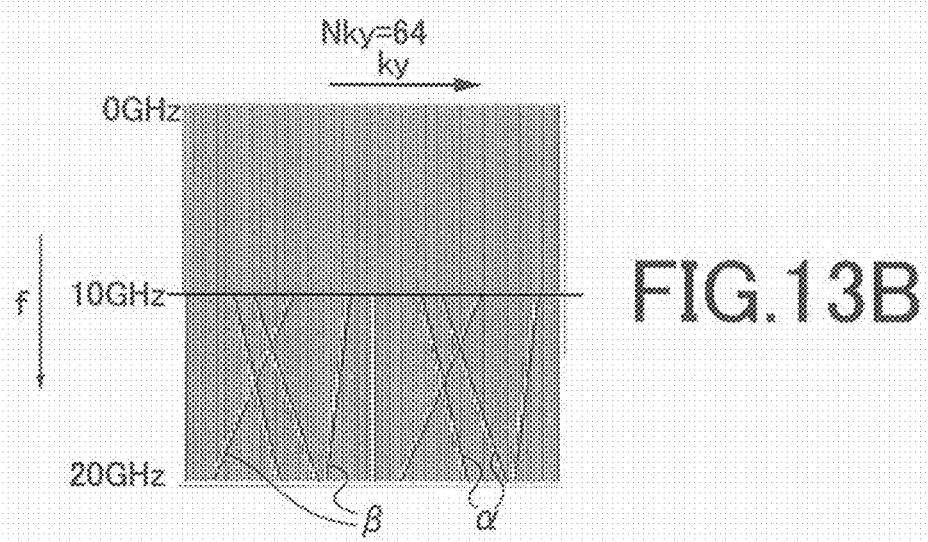

FIGS. 13A and 13B are graphs illustrating an example of data in a ky-f coordinate space of the ky component and the frequency f created by simulation. FIG. 13A illustrates the data created using the number of measurement data (sampling number) of the y-coordinate component of 128, and FIG. 13B illustrates the data created using the number of measurement data (sampling number) of the y-coordinate component of 64. In regard to the frequency f, only data having the value zero is present in the region of 0 to 10 GHz, and non-zero data is also included in the region of 10 to 20 GHz. The data illustrated in FIG. 13A is target data that needs to be calculated by the extension processing. There is no aliasing component in the data illustrated in FIG. 13A. On the contrary, the aliasing component appears in regions α and β in the data illustrated in FIG. 13B. The aliasing component can be removed using the interpolation filter as is described above.

Figure 13C:
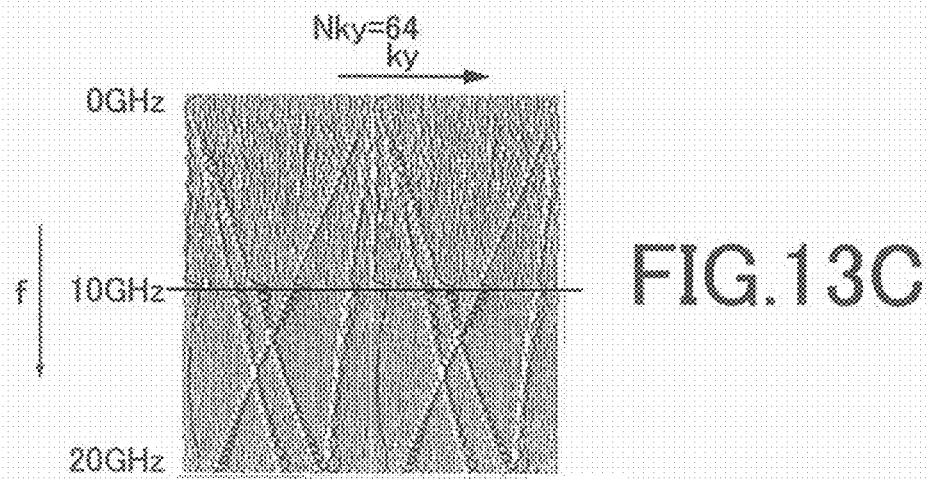
FIG. 13C is a graph illustrating an example of a result obtained by performing double DFT (discrete Fourier transform) processing on a corrected temporal waveform data set generated in an embodiment.

FIG. 13C is a graph illustrating an example of a result obtained by performing the double DFT processing on the corrected temporal waveform data $d_{ij}$ generated in the present embodiment. To be specific, FIG. 13C illustrates an example of data, which is obtained by expressing a result from the double DFT processing of the corrected temporal waveform data $d_{ij}$, obtained by performing the above-described local maximum value processing (see FIGS. 8A and 8B) on the data illustrated in FIG. 13B, on the ky-f coordinate space corresponding the data illustrated in FIG. 13A. As illustrated in FIG. 13C, data having a non-zero value is formed in the region of 0 to 10 GHz by performing the local maximum value processing. In this manner, it is possible to extract information on the low frequency, which is the minimum frequency or lower, through the local maximum value processing even when the minimum frequency of the frequency is a half the maximum frequency or higher.

In this manner, a reason why the information on the low frequency is extracted by performing the local maximum value processing is because the information on the low frequency is information that is necessary for generation of the interpolation filter. The interpolation filter demonstrates the function of suppressing the aliasing component using the information on the low frequency.

Figure 14:
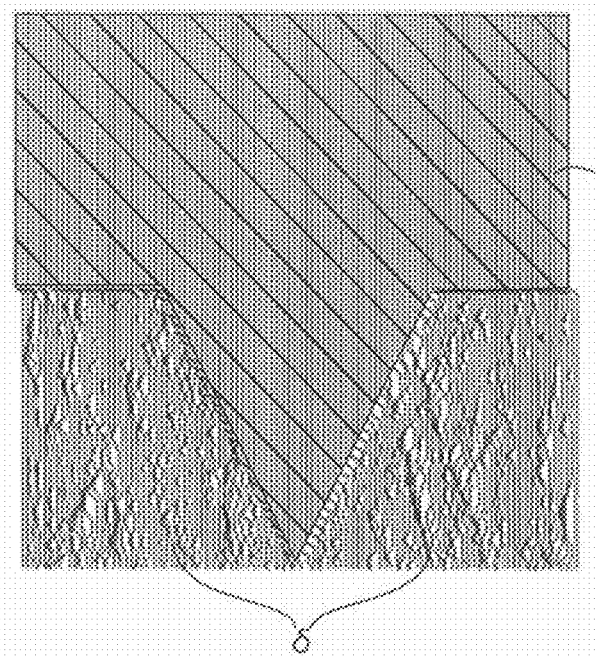
FIG. 14 is a view illustrating an example of a ratio (interpolation filter) which is used in an embodiment.

FIG. 14 is a view illustrating an example of the ratio (interpolation filter). In the ratio illustrated in FIG. 14, a value in a region γ is set to zero. Information on the ratio in a region δ is the information that is necessary for interpolation.

Figure 15A:
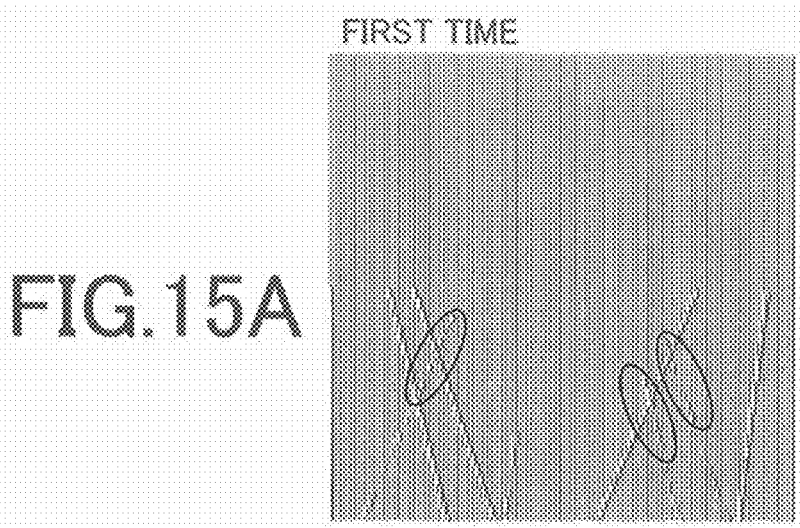
FIG. 15A is a view illustrating an example of a result obtained by applying the ratio (interpolation filter) used in an embodiment once.
Figure 15B:
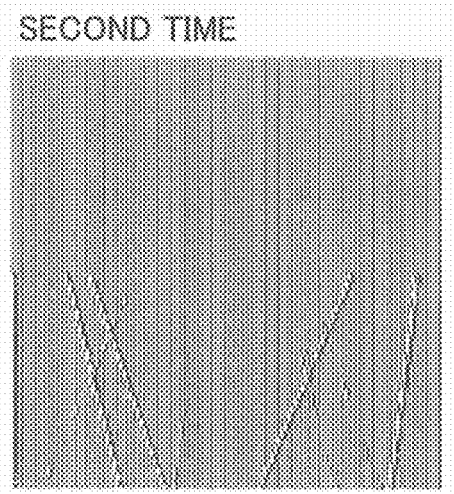
FIGS. 15B and 15C are views illustrating examples of results obtained by applying the ratio (interpolation filter) used in an embodiment a plurality of times (twice and ten times)
Figure 15C:
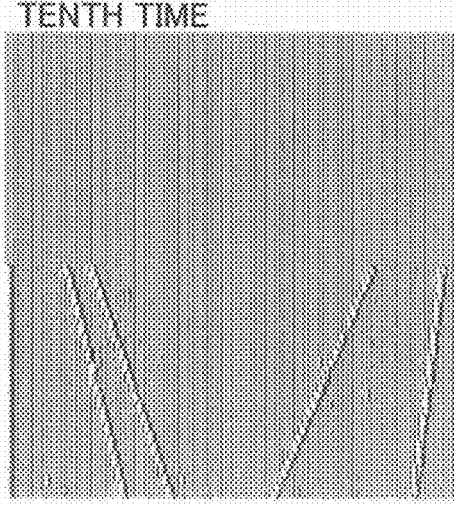

FIG. 15A is a view illustrating an example of a result of [D1(kx, ky, ω)/D2(kx, ky, ω)] D3(kx, ky, ω) in which the ratio (interpolation filter) is applied once, and FIGS. 15B and 15C are views illustrating examples of results of [D1(kx, ky, ω)/D2(kx, ky, ω)] D3(kx, ky, ω) in which the ratio (interpolation filter) is applied a plurality of times (twice and ten times).

The result obtained by applying the ratio (interpolation filter) for the first time, illustrated in FIG. 15A, shows that the aliasing component remains in a part surrounded by a solid line. It is understood that the aliasing component surrounded by the solid line in FIG. 15A is suppressed more as the number of times of application of the ratio (interpolation filter) increases. It is understood that the data illustrated in FIG. 15C is extremely close to the target data illustrated in FIG. 13A that needs to be calculated. The data in which the aliasing component is suppressed in this manner is set as the extended first processing data $S_2$(kx, ky, ω).

As described above, the extension processing of the first processing data S(kx, ky, ω) includes the interpolation filter processing using the local maximum value processing and the ratio (interpolation filter) according to the flow illustrated in FIG. 7. The second processor 66c generates the extended first processing data $S_2$(kx, ky, ω) by performing the extension processing of the first processing data S(kx, ky, ω) as described above.

Figure 16:
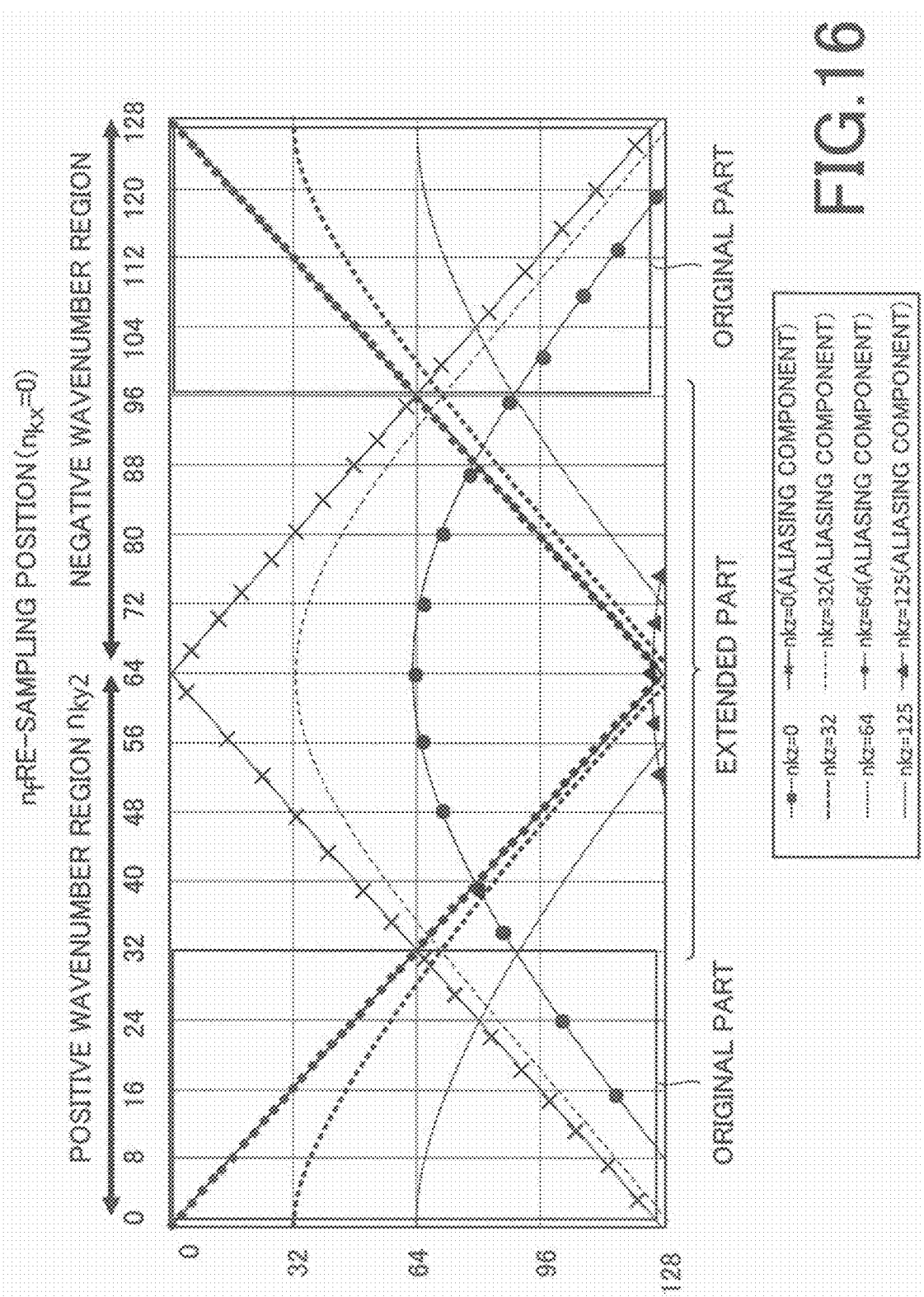
FIG. 16 is a view illustrating a graph, which corresponds to the graph illustrated in FIG. 6A, of extended first processing data generated in an embodiment.

FIG. 16 is a view illustrating a graph, which corresponds to the graph illustrated in FIG. 6, of the extended first processing data $S_2$(kx, ky, ω). In FIG. 16, a discrete value parameter with the sampling number of $2 \cdot N_{ky}$ (=128), obtained by doubling $N_{ky}$ (=64), is set to $n_{ky2}$. In the discrete value parameter $n_{ky2}$, the ky component has the maximum wavenumber when $n_{ky2}$=64. In FIG. 16, a new aliasing component is not generated by extending the ky component since solid straight lines or solid curves do not cross each other at $n_{ky2}$=64.

Figure 17:
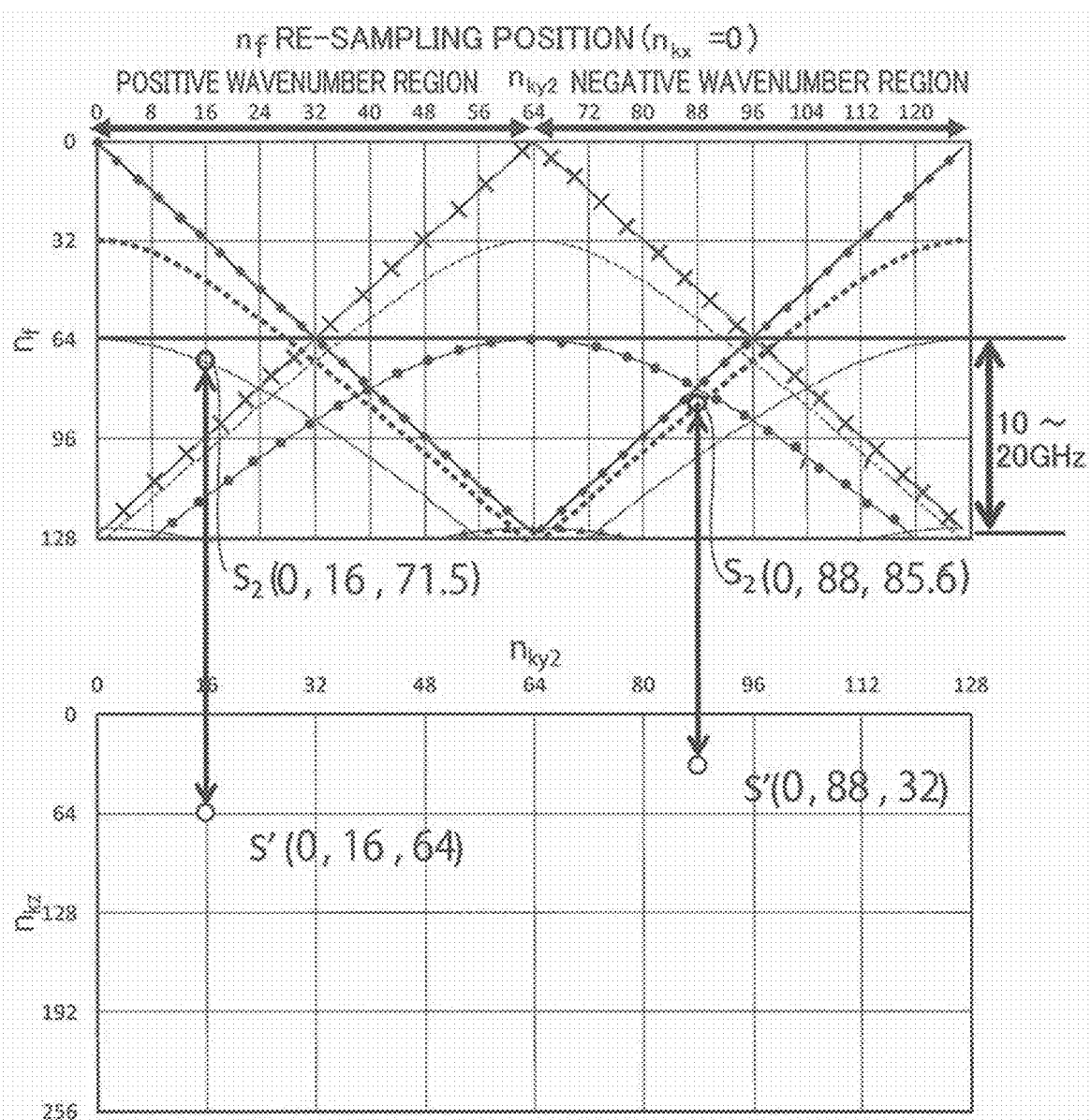
FIG. 17 is a view illustrating an example of a relationship between the extended first processing data and second processing data generated in an embodiment.

FIG. 17 illustrates an example of reconstruction, that is, calculation of the second processing data S'(kx, ky, kz) using a result from extension of the first processing data S(kx, ky, ω). FIG. 17 is a view illustrating an example of a relationship between the extended first processing data $S_2$(kx, ky, ω) and the second processing data S'(kx, ky, kz). In FIG. 17, the value of the kx component, the value of the ky component, and the value of the kz component of the second processing data S'(kx, ky, kz) are substituted by the corresponding values of $n_{kx}$, $n_{ky2}$, and $n_{kz}$, and the value of the kx component, the value of the ky component, and the value of w of the extended first processing data $S_2$(kx, ky, ω) are substituted by values of $n_{kx}$, $n_{ky2}$, and $n_f$, which is similar to the processing illustrated in FIG. 5. In one example illustrated in FIG. 17, the restraint condition is satisfied using $n_{kx}$=0, $n_{ky2}$=16, and $n_f$=71.5 when $n_{kx}$=0, $n_{ky}$=16, and $n_{kz}$=64. In another example, the restraint condition is satisfied using $n_{kx}$=0, $n_{ky2}$=88, and $n_f$=85.6 when $n_{kx}$=0, $n_{ky2}$=88, and $n_{kz}$=32. Accordingly, a value of the extended first processing data $S_2$(kx, ky, ω) in the case where $n_{kx}$=0, $n_{ky2}$=16, and $n_f$=71.5 is calculated by performing the interpolation using a value of the extended first processing data $S_2$(kx, ky, ω) in a case where $n_{kx}$=0, $n_{ky2}$=16, and $n_f$=71 and a value of the extended first processing data $S_2$(kx, ky, ω) in a case where $n_{kx}$=0, $n_{ky2}$2=16, and $n_f$=72. A value of the extended first processing data $S_2$(kx, ky, ω) in the case where $n_{kx}$=0, $n_{ky2}$=88, $n_f$=85.6 is also calculated using the same method.

Such extension and reconstruction are performed by the second processor 66c. Accordingly, the second processing data S'(kx, ky, kz) calculated by the second processor 66c includes the extended ky component.

(Data Processing Method)

Figure 18:
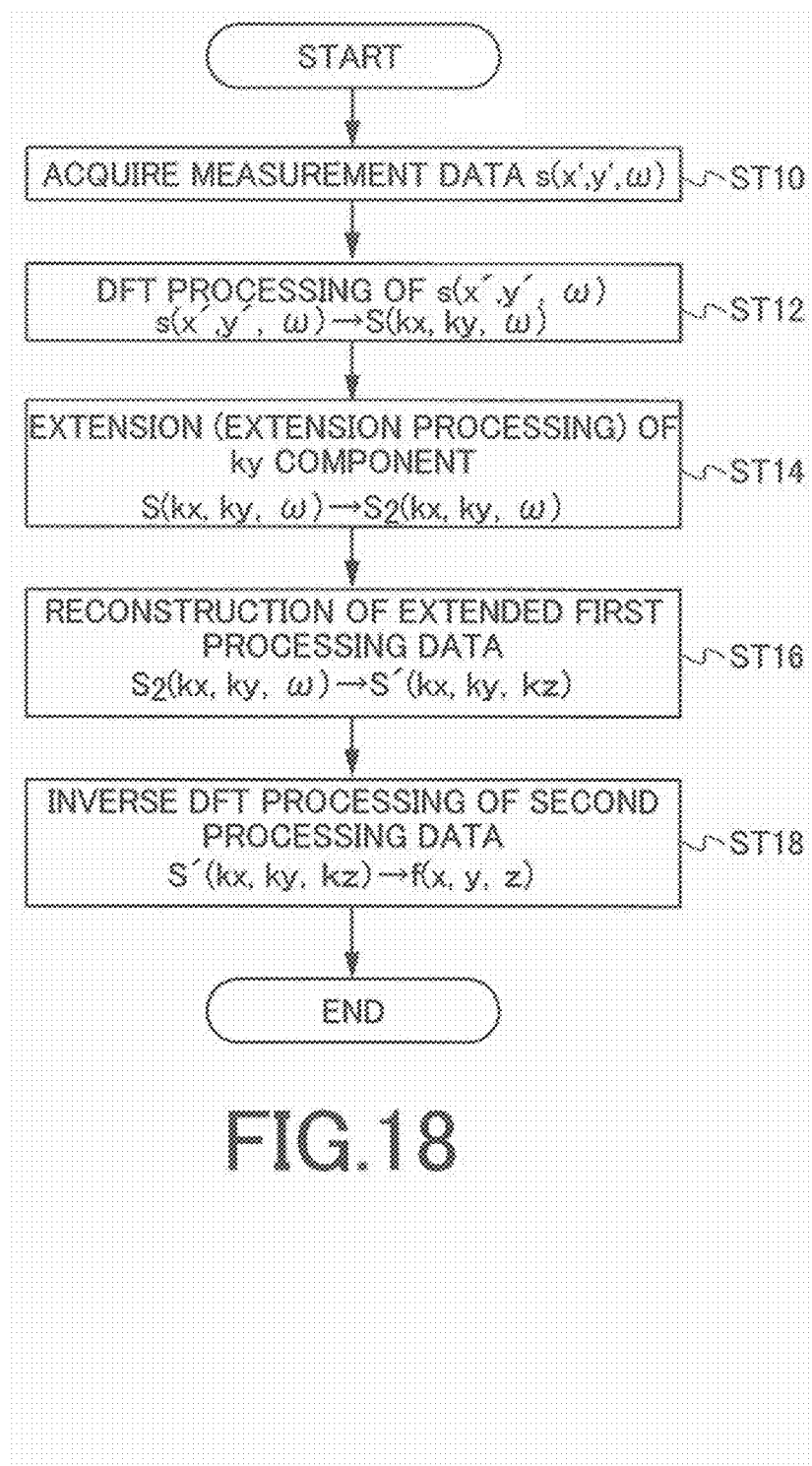
FIG. 18 is a view illustrating an example of a flow of data processing which is performed in an embodiment.

FIG. 18 is a view illustrating an example of a flow of the data processing.

The data processing unit 66 first acquires the measurement data s(x', y', ω) and stores the acquired data in the storage unit 66a (ST10).

Then, the first processor 66b calculates the first processing data S(kx, ky, ω) by performing frequency conversion processing (DFT processing) with respect to to the x-coordinate component and the y-coordinate component, on the measurement data s(x', y', ω) (ST12).

Then, the second processor 66c generates the extended first processing data $S_2$(kx, ky, ω) in which the extended data is incorporated into the first processing data S(kx, ky, ω) by increasing $ky_{max}$ by extending the ky component of the first processing data S(kx, ky, ω) as described above (ST14).

Further, the second processor 66c calculates the second processing data S'(kx, ky, kz) from the extended first processing data $S_2$(kx, ky, ω) by seeking the kz component (first wavenumber component) using the angular frequency ω (or the frequency f), the kx component, and the ky component under the restraint condition of $k_x^2 + k_y^2 + k_z^2 = 4 \times \varepsilon_r \times (\omega/c_0)^2$ (ST16).

Finally, the third processor 66d calculates the third processing data f(x, y, z) by performing a process of converting (inverse DFT) the kx component, the ky component, and the kz component of the second processing data S'(kx, ky, kz) into the x-coordinate component, the y-coordinate component, and the z-coordinate component (ST18). The value of f(x, y, z) is fixed by values of the x-coordinate component, the y-coordinate component, and the z-coordinate component.

In this manner, the ky component can be extended since the measurement number $N_f$ of the frequency f of the electromagnetic wave is large, and the measurement data s(x', y', ω) includes information related to a wavenumber of the ky component larger than the value of the maximum wavenumber of the ky component $ky_{max}$(=π/Δy) that is determined based on the sampling theorem at the sampling interval Δy. In particular, Δy is the sampling interval of the transmitting and receiving points determined by the transmission antenna 10a and the reception antenna 10b, Thus, to decrease Δy results in the increase of the number of the arranged transmission antennas and reception antennas. Accordingly, Δy is restricted. In the present embodiment, it is possible to increase the maximum wavenumber of the ky component $ky_{max}$ by extending the ky component described above even when the sampling interval $\Delta y$ is large. Thus, the data interval of the y-coordinate component of the third processing data f(x, y, z) obtained by the inverse DFT processing becomes shorter. For example, when the maximum wavenumber $ky_{max}$ becomes n times, the data interval of the y-coordinate component becomes 1/n times. Accordingly, it is possible to improve the spatial resolution in the measurement. For example, it is possible to set the spatial resolution to be the theoretical resolution (a fourth of the wavelength corresponding to the center frequency of the electromagnetic wave). Although the example of extending the ky component has been described in the present embodiment, the kx component can be also extended. Since the x-direction is the scan direction of the transmission array antenna 50 and the reception array antenna 52 as illustrated in FIG. 3, it is possible to improve the spatial resolution in the scan direction by extending the kx component instead of the ky component even when a measurement interval in the scan direction is large.

Of course, it is also possible to simultaneously extend the kx component and the ky component using three factors of the kx and ky components, and the frequency at the same time in the local maximum value processing used at the time of the above-described extension and the processing using the interpolation filter. In this case, the triple DFT processing and the triple inverse DFT processing are used instead of the double DFT processing and the double inverse DFT processing.

When the measurement data s(x', y', ω) is set such that $\Delta x=2$ mm, a measurement number $N_x$ of the x-coordinate component (=$N_{kx}$)=256, $\Delta y=7.5$ mm, a measurement number $N_y$ of the y-coordinate component (=$N_{ky}$)=64, the maximum frequency $f_{max}=20$ GHz, a minimum frequency $f_{min}=10$ GHz, the measurement number $N_f=64$, and the relative dielectric constant $\varepsilon_r=1$, for example, a fourth of the minimum wavelength (the wavelength of 15 mm at the maximum frequency of 20 GHz) of the electromagnetic wave is 3.75 mm. Since $\Delta x=2$ mm is a fourth of the minimum wavelength (=3.75 mm) or smaller, the spatial resolution in the x-direction is 5 mm which is a fourth of a wavelength (minimum wavelength) at a center frequency of 15 GHz in the frequency band of 10 to 20 GHz, that is, the theoretical resolution. However, $\Delta y=7.5$ mm is larger than a fourth of the above-described minimum wavelength (=3.75 mm), and thus, the spatial resolution in the y-direction is 7.5 mm which is larger than a fourth of the above-described minimum wavelength. The spatial resolution in the y-direction is rough as compared to the theoretical resolution of 5 mm.

In the present embodiment, the ky component is extended by setting the sampling number $N_{ky}$ of the ky component as 2 $N_{ky}$, and doubling the maximum wavenumber of the ky component $ky_{max}$ such that the sampling interval of the y-coordinate component after being processed becomes $\pi/(2 ky_{max})$ when the inverse DFT processing is performed. Thus, the sampling interval becomes 3.75 mm which is a half of $\Delta y=7.5$ mm. Accordingly, this sampling interval is a fourth of the wavelength of the minimum wavelength or smaller (=3.75 mm), the spatial resolution in the y-direction becomes the theoretical resolution of 5 mm.

In this manner, the sampling interval (data interval) of the y-coordinate component becomes 1/n by extending the ky component n times. Accordingly, it is preferable that the sampling interval (data interval) corresponding to the extended ky component be a fourth of the minimum wavelength, which is the wavelength corresponding to the maximum frequency, or smaller in order to improve the spatial resolution in the y-direction in the radar apparatus 60 or the data processing according to the present embodiment. That is, it is preferable to extend the ky component such that the sampling interval (data interval) of the y-coordinate component becomes a fourth of the minimum wavelength, which is the wavelength corresponding to the maximum frequency, or smaller. At this time, it is preferable to repeat extension of the range of the ky component, the extension being arranged to double the range of the ky component before being extended each time such that the sampling interval (data interval) of the y-coordinate component becomes a fourth of the above-described minimum wavelength or smaller in the radar apparatus 60 or the data processing according to the present embodiment.

In such a preferable aspect, the ky component is set as the extension target, but the kx component can be set as an extension target when $\Delta x$ is larger than a fourth of the above-described minimum wavelength. In addition, the kx component and the ky component can be also set as extension targets, simultaneously.

In the radar apparatus 60 or the data processing according to the present embodiment, a method (single-pass method) of using the pair of the transmission antenna 10*a* and the reception antenna 19*b*, which are the closest to each other, is used as the transmission and reception method of the electromagnetic wave. However, it is also possible to use a method (multi-pass method) of obtaining measurement data by causing the reflected wave of the electromagnetic wave radiating from the single transmission antenna 10*a* to be received not only by the reception antenna 10*b* which is the closest to this transmission antenna but also by the reception antenna 10*b* at a position separated from the transmission antenna. However, it is preferable to use the single-pass method described above. That is, the following aspect is preferable. The measurement data s(x', y', ω) is the data that can be obtained by causing the reflected wave of the electromagnetic wave that is transmitted from each of the plurality of transmission antennas 10*a* to be received by the reception antenna 10*b* at the position the closest to the corresponding transmission antenna 10*a* among the plurality of reception antennas 10*b*. The reception antennas 10*b* are arranged in the y-direction at the first interval ($2\Delta y$ in FIG. 3) and are provided to be shifted in the y-direction by a length which is a half of the first interval with respect to the arrangement of the transmission antennas 10*a*. The sampling interval $\Delta y$ of the y-coordinate component corresponding to the ky component is the length which is a half of the first interval.

In the radar apparatus 60 or the data processing according to the present embodiment, the wavenumber component to be extended preferably includes the ky component which corresponds to the y-coordinate component in the arrangement direction (the y-direction) of the transmission antenna 10*a* and the reception antenna 10*b*.

In addition, the wavenumber component to be extended preferably includes the kx component which corresponds to the x-coordinate component in the x-direction, which is an in-plane direction of the plane in which the transmission antenna 10*a* and the reception antenna 10*b* are provided, and is orthogonal to the y-direction in the radar apparatus 60 or the data processing according to the present embodiment.

In the radar apparatus 60 or the data processing according to the present embodiment, the transmission antenna 10*a* and the reception antenna 10*b* preferably scan the object to be measured while relatively moving in the x-direction.

Incidentally, the restraint condition used at the time of obtaining the kz component from ω in the present embodiment is preferably $k_x^2+k_y^2+k_z^2=4\times\varepsilon_r\times(\omega/c_0)^2$ ($c_0$ is the speed of light in vacuum, $\varepsilon_r$ is a relative dielectric constant of a medium propagated in the electromagnetic wave, and $\omega=2\pi f$).

Although the data processing method and the measurement device according to the present technology have been described in detail as above, the present technology is not limited to the above-described embodiment. It is a matter of course that various types of improvement and modifications may be performed in a range without departing from a gist of the present technology.

What is claimed is:

1. A data processing method that causes a computer to process measurement data of a wave whose value is fixed by a frequency of the wave generated in a space and a value of a spatial coordinate of the space, the method comprising:

(A) a step of causing the computer to acquire measurement data whose value is fixed by the frequency and a value of at least one of second spatial coordinate components of the space while generating the wave having the frequency changed at a set frequency interval, the measurement data being acquired by sampling, at a spatial sampling interval, a response of the wave in the space, the sampling interval being larger regarding the second spatial coordinate components of the space than a spatial resolution defined by a sampling theorem from a maximum frequency of the frequency, the second spatial coordinate components being portions of whole spatial coordinate components of the space except for a first spatial coordinate component;

(B) a step of causing the computer to convert the second spatial coordinate components of the measurement data into wavenumber components to calculate first processing data, the first processing data being a wavenumber conversion result of the measurement data whose value is fixed by the frequency and values of the wavenumber components corresponding to the second spatial coordinate components;

(C) a step of causing the computer to reconstruct the first processing data into second processing data by calculating a first wavenumber component corresponding to the first spatial coordinate component from the frequency and the wavenumber components corresponding to the second spatial coordinate components under a restraint condition, a value of the second processing data being fixed by values of whole wavenumber components corresponding to the whole spatial coordinate components of the space, the restraint condition defining relation between the whole wavenumber components corresponding to the whole spatial coordinate components of the space and the frequency; and (D) a step of causing the computer to convert the whole wavenumber components of the second processing data into the whole spatial coordinate components of the space to calculate third processing data whose value is fixed by values of the whole spatial coordinate components, wherein the step of causing the computer to reconstruct the first processing data includes a step of causing the computer to perform extension processing on the first processing data to extend a maximum wavenumber of a second wavenumber component corresponding to at least one of second spatial coordinate components, the extension processing being defined by a local maximum value processing and an interpolation filter processing, the local maximum value processing being a processing to correct temporal waveform data to a corrected temporal waveform data set including corrected temporal waveform data, the temporal waveform data being generated from the first processing data by converting the second wavenumber component and the frequency of the first processing data into a corresponding spatial coordinate component that corresponds to the second wavenumber component and a time component, the temporal waveform data being corrected to the corrected temporal waveform data for each value of the corresponding spatial coordinate component by holding only local maximum values of absolute values of the temporal waveform data along a time axis while assigning a value zero to an area other than data points of the local maximum values, and the interpolation filter processing being a processing that includes (E1) a step of causing the computer to arrange the corrected temporal waveform data set in a range of the corresponding spatial coordinate component before being extended and a range of the time component before being extended on an extended coordinate space in which the range of the corresponding spatial coordinate component and the range of the time component of the corrected temporal waveform data set are extended, and to generate a first extended/corrected temporal waveform data set and a second extended/corrected temporal waveform data set, the first extended/corrected temporal waveform data set including first extended/corrected temporal waveform data in which a value zero is assigned to an extended part on the extended coordinate space, the second extended/corrected temporal waveform data set including the first extended/corrected temporal waveform data, in which a value zero is assigned every certain interval of the corresponding spatial coordinate component in the first extended/corrected temporal waveform data set;

(E2) a step of causing the computer to generate a ratio between first extended/corrected frequency and wavenumber data and second extended/corrected frequency and wavenumber data, the first extended/corrected frequency and wavenumber data being obtained by converting and expressing the first extended/corrected temporal waveform data set with a second wavenumber component and the frequency, and the second extended/corrected frequency and wavenumber data being obtained by converting and expressing the second extended/corrected temporal waveform data set with the second wavenumber component and the frequency; and (E3) a step of causing the computer to generate a third extended/corrected temporal waveform data set including third extended/corrected temporal waveform data, the third extended/corrected temporal waveform data set being obtained by arranging the corrected temporal waveform data at the certain interval in the corresponding spatial coordinate component on the extended coordinate space and assigning a value zero to a part other than a part in which the corrected temporal waveform data is arranged, and to multiply or divide third extended/corrected frequency and wavenumber data by the ratio, the third extended/corrected frequency and wavenumber data being obtained by converting and expressing the third extended/corrected temporal waveform data set with the second wavenumber component and the frequency, in order to obtain a result of the extension processing.

2. The data processing method according to claim 1, wherein
the extension processing includes
(E4) a step of causing the computer
to obtain processing data by multiplying or dividing the third extended/corrected frequency and wavenumber data by the ratio, and further to obtain processing temporal waveform data by converting and expressing the processing data with the corresponding spatial coordinate component and the time component;
to generate fourth extended/corrected temporal waveform data set from the third extended/corrected temporal waveform data set by assigning a value of the processing temporal waveform data of a part corresponding to a zero-filled part in which the value zero is assigned in the step (E3), to the zero-filled part instead of the value zero in the third extended/corrected temporal waveform data set, and to newly set the fourth extended/corrected temporal waveform data set as the third extended/corrected temporal waveform data set; and,
to multiply or divide the third extended/corrected frequency and wavenumber data by the ratio, the third extended/corrected frequency and wavenumber data being obtained by converting and expressing the newly set third extended/corrected temporal waveform data set with the second wavenumber component and the frequency.

3. The data processing method according to claim 2, wherein
the extension processing includes causing the computer to execute repeatedly the step (E4) by using a calculation result obtained by multiplying or dividing the third extended/corrected frequency and wavenumber data by the ratio as the processing data, and to determine the calculation result obtained after repeatedly executing the step (E4) a plurality of times as extended data of the first processing data.

4. The data processing method according to claim 1, wherein
a minimum frequency of the frequency is a half of the maximum frequency or higher.

5. The data processing method according to claim 1, wherein
a data interval of a spatial coordinate component corresponding to the extended second wavenumber component is a fourth or smaller of a wavelength corresponding to the maximum frequency.

6. The data processing method according to claim 1, wherein
when an object to be measured is irradiated with an electromagnetic wave from each of a plurality of transmission antennas arranged at a certain first interval in a first direction, the measurement data is obtained by causing a reflected wave of the electromagnetic wave reflected from the object to be measured to be received by each reception antenna, which is at a position closest to each of the transmission antennas, among a plurality of the reception antennas,
the reception antennas are arranged at the first interval in the first direction and are provided to be shifted in the first direction by a length, which is a half of the first interval, with respect to arrangement of the transmission antennas, and
a sampling interval of a spatial coordinate component corresponding to the second wavenumber component is a length which is a half of the first interval.

7. The data processing method according to claim 6, wherein
the second wavenumber component includes a wavenumber component which corresponds to a spatial coordinate component in the first direction.

8. The data processing method according to claim 6, wherein
the second wavenumber component includes a wavenumber component which corresponds to a spatial coordinate component in a second direction that is an in-plane direction of a plane in which the transmission antennas and the reception antennas are provided and is orthogonal to the first direction.

9. The data processing method according to claim 8, wherein
the transmission antennas and the reception antennas relatively move with respect to the object to be measured in the second direction.

10. The data processing method according to claim 6, wherein
the first spatial coordinate component is a spatial coordinate component in a normal direction of the plane in which the transmission antennas and the reception antennas are provided.

11. The data processing method according to claim 1, wherein
when all the wavenumber components are set to $k_x$, $k_y$ and $K_z$, and the frequency is set to f, the restraint condition is $k_x^2+k_y^2+k_z^2=4\times\varepsilon_r\times(2\pi f/c_0)^2$, where $c_o$ is speed of light in vacuum and $\varepsilon_r$ is a relative dielectric constant of a medium propagated in the electromagnetic wave.

12. A measurement device that measures a wave whose value is fixed by a frequency of the wave generated in a space and a value of a spatial coordinate of the space and performs data processing, the measurement device comprising:
a measurement unit that includes a transmission unit which is configured to generate a wave having a frequency changed at a set frequency interval, a reception unit which is configured to receive a response of the wave in the space relating to the wave at a spatial sampling interval, the spatial sampling interval being larger regarding the second spatial coordinate components of the space than a spatial resolution defined from a maximum frequency of the frequency according to a sampling theorem, the second spatial coordinate components being portions of whole spatial coordinate components of the space except for a first spatial coordinate component, and an acquisition unit which is configured to generate measurement data whose value is fixed by the frequency and a value of the second spatial coordinate component through reception of the reception unit; and
a data processing unit which is configured to calculate third processing data whose value is fixed by values of all the spatial coordinate components inside the space from the measurement data,
wherein the data processing unit includes:
a first processor which is configured to calculate first processing data whose value is fixed by a value of a wavenumber component corresponding to the second spatial coordinate component and the frequency by converting the second spatial coordinate component of the measurement data into the wavenumber component;

a second processor which is configured to reconstruct the first processing data by obtaining a first wavenumber component, which corresponds to the first spatial coordinate component, from the frequency and the wavenumber component corresponding to the second spatial coordinate component under a restraint condition among all the wavenumber components corresponding to all the spatial coordinate components inside the space and the frequency, and to calculate second processing data whose value is fixed by values of all the wavenumber components corresponding to all the spatial coordinate components inside the space; and a third processor which is configured to calculate the third processing data whose value is fixed by values of all the spatial coordinate components by converting all the wavenumber components of the second processing data into all the spatial coordinate components, and the second processor is configured to perform extension processing of extending a maximum wavenumber of a second wavenumber component, which corresponds to at least one of the second spatial coordinate components, on the first processing data, the second processor including a fourth processor and a fifth processor for the extension processing, the fourth processor configured to generate a corrected temporal waveform data set including corrected temporal waveform data, the corrected temporal waveform data being obtained by correcting temporal waveform data that is generated from the first processing data by converting the second wavenumber component and the frequency of the first processing data into a corresponding spatial coordinate component that corresponds to the second wavenumber component and a time component, the temporal waveform data being corrected to obtain the corrected temporal waveform data for each value of the corresponding spatial coordinate component by holding only local maximum values of absolute values of the temporal waveform data along an time axis while assigning a value zero to an area other than data points of the local maximum values; and the fifth processor which is configured to perform the extension processing using the corrected temporal waveform data set, the extension processing being processing performed by the fifth processor, the fifth processor including:

a processor A configured to arrange the corrected temporal waveform data set in a range of the corresponding spatial coordinate component before being extended and a range of the time component before being extended on an extended coordinate space in which the range of the corresponding spatial coordinate component and the range of the time component of the corrected temporal waveform data set are extended, and to generate a first extended/corrected temporal waveform data set including first extended/corrected temporal waveform data in which a value zero is assigned to an extended part on the extended coordinate space;

a processor B configured to generate a second extended/corrected temporal waveform data set including the first extended/corrected temporal waveform data, in which a value zero is assigned every certain interval of the corresponding spatial coordinate component in the first extended/corrected temporal waveform data set;

a processor C configured to generate a ratio between first extended/corrected frequency and wavenumber data and second extended/corrected frequency and wavenumber data, the first extended/corrected frequency and wavenumber data being obtained by converting and expressing the first extended/corrected temporal waveform data set with a second wavenumber component and the frequency, and the second extended/corrected frequency and wavenumber data being obtained by converting and expressing the second extended/corrected temporal waveform data set with the second wavenumber component and the frequency;

a processor D configured to generate a third extended/corrected temporal waveform data set including third extended/corrected temporal waveform data, the third extended/corrected temporal waveform data set being obtained by arranging the corrected temporal waveform data at the certain interval in the corresponding spatial coordinate component on the extended coordinate space and assigning a value zero to a part other than a part in which the corrected temporal waveform data is arranged; and a processor E configured to extend the first processing data by multiplying or dividing third extended/corrected frequency and wavenumber data by the ratio, the third extended/corrected frequency and wavenumber data being obtained by converting and expressing the third extended/corrected temporal waveform data set with the second wavenumber component and the frequency.

13. The measurement device according to claim 12, wherein the transmission unit includes a plurality of transmission antennas which are configured to emit an electromagnetic wave to an object to be measured and are arranged at a certain first interval in a first direction, the reception unit includes a plurality of transmission antennas which are configured to receive reflected wave of the electromagnetic wave reflected from the object to be measured and are arranged at the first interval in the first direction, the reception antennas are provided to be shifted in the first direction by a length, which is a half of the first interval, with respect to arrangement of the transmission antennas, and a sampling interval of a spatial coordinate component corresponding to the second wavenumber component is a length which is a half of the first interval.

14. The measurement device according to claim 12, wherein the fifth processor further includes:

a processor F configured to obtain processing data by multiplying or dividing the third extended/corrected frequency and wavenumber data by the ratio, and further to obtain processing temporal waveform data by converting and expressing the processing data with the corresponding spatial coordinate component and the time component, and to generate fourth extended/corrected temporal waveform data set from the third extended/corrected temporal waveform data set by assigning a value of the processing temporal waveform data of a part corresponding to a zero-filled part in which the value zero is assigned in the step (E3), to the zero-filled part instead of the value zero in the third extended/corrected temporal waveform data set, and to newly set the fourth extended/corrected temporal waveform data set as the third extended/corrected temporal waveform data set; and a processor G configured to multiply or divide the third extended/corrected frequency and wavenumber data by the ratio, the third extended/corrected frequency and wavenumber data being obtained by converting and expressing the newly set third extended/corrected temporal waveform data set with the second wavenumber component and the frequency.

* * * * *